(12) United States Patent
Smet et al.

(10) Patent No.: US 10,360,736 B2
(45) Date of Patent: Jul. 23, 2019

(54) VISUAL EDITOR FOR DESIGNING AUGMENTED-REALITY EFFECTS

(71) Applicant: Facebook, Inc., Menlo Park, CA (US)

(72) Inventors: Stef Marc Smet, London (GB); Dolapo Omobola Falola, London (GB); Michael Slater, Nottingham (GB); Samantha P. Krug, New York, NY (US); Volodymyr Gigniak, London (GB); Hannes Luc Herman Verlinde, London (GB); Sergei Viktorovich Anpilov, London (GB); Danil Gontovnik, London (GB); Yu Hang Ng, London (GB); Siarhei Hanchar, London (GB); Milen Georgiev Dzhumerov, Sevenoaks (GB)

(73) Assignee: Facebook, Inc., Menlo Park, CA (US)

( * ) Notice: Subject to any disclaimer, the term of this patent is extended or adjusted under 35 U.S.C. 154(b) by 217 days.

(21) Appl. No.: 15/615,471

(22) Filed: Jun. 6, 2017

(65) Prior Publication Data

US 2018/0268615 A1 Sep. 20, 2018

Related U.S. Application Data

(63) Continuation-in-part of application No. 15/460,121, filed on Mar. 15, 2017, and a continuation-in-part of application No. 15/460,104, filed on Mar. 15, 2017, and a continuation-in-part of application No. 15/460,087, filed on Mar. 15, 2017.

(51) Int. Cl.
*G06T 19/20* (2011.01)
*G06T 19/00* (2011.01)
*G06F 3/14* (2006.01)

(52) U.S. Cl.
CPC ............ *G06T 19/20* (2013.01); *G06F 3/1438* (2013.01); *G06T 19/006* (2013.01); *G06T 2200/24* (2013.01); *G06T 2215/16* (2013.01)

(58) Field of Classification Search
CPC ..................................................... G06T 19/20
USPC .......................................................... 715/719
See application file for complete search history.

(56) References Cited

U.S. PATENT DOCUMENTS

| | | | |
|---|---|---|---|
| 9,454,849 B2 * | 9/2016 | Mount | G06T 19/006 |
| 2009/0279784 A1 * | 11/2009 | Arcas | G06T 17/00 382/190 |
| 2012/0015316 A1 * | 1/2012 | Sachdeva | G06T 17/00 433/24 |

(Continued)

*Primary Examiner* — William D Titcomb
(74) *Attorney, Agent, or Firm* — Baker Botts L.L.P.

(57) ABSTRACT

In one embodiment, a method for designing an augmented-reality effect may include receiving a model definition of a virtual object. The virtual object may be rendered in a 3D space based on the model definition. The system may display the virtual object in the 3D space from a first perspective in a first display area of a user interface. The system may display the virtual object in the 3D space from a second perspective, different from the first, in a second display area of the user interface. The system may receive a user command input by a user through the first display area for adjusting the virtual object. The virtual object may be adjusted according to the user command. The system may display the adjusted virtual object in the 3D space from the first perspective in the first display area and from the second perspective in the second display area.

20 Claims, 24 Drawing Sheets

(56) References Cited

U.S. PATENT DOCUMENTS

| | | | |
|---|---|---|---|
| 2013/0335405 A1* | 12/2013 | Scavezze | G06T 19/20 345/419 |
| 2014/0354628 A1* | 12/2014 | Lindberg | G06T 19/20 345/419 |
| 2015/0130701 A1* | 5/2015 | Kimenkowski | G06T 19/20 345/156 |
| 2015/0243082 A1* | 8/2015 | Ueno | G06T 19/20 345/633 |
| 2018/0012417 A1* | 1/2018 | Haseltine | G06T 19/20 |
| 2018/0046245 A1* | 2/2018 | Schwarz | G02B 27/0093 |
| 2018/0210628 A1* | 7/2018 | McPhee | G06F 3/04815 |
| 2018/0262713 A1* | 9/2018 | Huang | G06T 19/006 |

* cited by examiner

VISUAL EDITOR FOR DESIGNING AUGMENTED-REALITY EFFECTS

PRIORITY

This application is a continuation-in-part under 35 U.S.C. § 120 of U.S. patent application Ser. No. 15/460,121, filed 15 Mar. 2017. This application is a continuation-in-part under 35 U.S.C. § 120 of U.S. patent application Ser. No. 15/460,087, filed 15 Mar. 2017. This application is a continuation-in-part under 35 U.S.C. § 120 of U.S. patent application Ser. No. 15/460,104, filed 15 Mar. 2017. The aforementioned applications are all hereby expressly incorporated by reference.

TECHNICAL FIELD

This disclosure generally relates to an editor for designing computer-generated effects.

BACKGROUND

Augmented reality provides a view of the real or physical world with added computer-generated sensory inputs (e.g., visual, audible). In other words, computer-generated or virtual effects augment or supplement the real-world view. For example, a mobile phone with a camera may capture a real-world scene and display a composite of the captured scene with computer-generated objects. The visual objects may be, for example, two-dimensional and/or three-dimensional objects.

The conventional process for designing an augmented reality effect may be time consuming and labor-intensive. An augmented reality design, at a high level, comprises art work to be displayed (e.g., drawings or computer-rendered objects) and software instructions for controlling how the art work would appear in the augmented-reality scene. The design process for an augmented-reality effect typically requires several iterations of designing and modifying the art work and the software instructions in order to fine tune the desired effect. The process may be further complicated since the artist and programmer are usually different persons. Thus, a typical design flow may require, e.g., designing an art work by an artist, integrating the art work into an effect by a programmer, assessing the result, having the artist and/or the programmer refine the art work and/or the software instructions, and repeating until the desired augmented-reality effect is achieved.

In operation, after an augmented-reality effect has been designed, objects appearing in the effect may be rendered by end-user devices (e.g., smart phone, tablet, laptop, desktop, etc.). The objects, which may be defined in three-dimensional space, may be processed or rendered one by one. Typically, the rendering order may be based on the objects' distance from the viewer or the display region. For example, if a scene on Mars includes a red filter, smoke, and an astronaut placed in that order in three-dimensional space from the viewer, the three objects may be rendered in that same sequence (e.g., closer objects may be rendered first).

Augmented-reality effects may be displayed through a variety of devices. For example, augmented-reality effects may be displayed on a user's mobile phone, tablet, laptop, computer monitor, television, or any other display devices. However, different display devices may have different aspect ratios, resolution, display orientations, and/or other display features. Even if an augmented-reality effect is displayed as desired on one device in a particular viewing mode, it may not display as desired on a different device or in a different viewing mode.

SUMMARY OF PARTICULAR EMBODIMENTS

Particular embodiments of the subject matter disclosed herein relates to an augmented-reality design editor (hereinafter "Editor") that provides an environment where composition of art work and effects may be designed and displayed dynamically in real-time, thereby enabling a designer to quickly fine tune, adjust, and test augmented-reality effects. For example, the Editor may provide various features allowing a designer to import an artistic object, incorporate the object into an augmented-reality effect, and make adjustments to the object and/or augmented-reality effect. In particular embodiments, the Editor may provide the designer with real-time visual feedback of the current state of the design during the design process.

In particular embodiments, the Editor may provide an intuitive yet powerful user interface for allowing a designer to specify how object scaling should occur when dimensions of the display canvas change (e.g., such as when a device switches from portrait view to landscape view). For example, the designer may specify scaling parameters for objects, such as designating a reference point (e.g., an anchor, a pivot point, and a scaling point) for scaling operations (e.g., positioning, rotation, and scaling). As another example, the designer may also designate certain scaling parameters as being responsive for fixed. For instance, responsive dimensions of an object may adjust based on the dimensions of the display region, and fixed dimensions may remain the same regardless of the dimensions of the display region.

In particular embodiments, the Editor may provide configuration options for designers to control how objects are to be rendered in operation. In particular embodiments, the relative rendering order of each object may be individually specified, regardless of the positions of the objects relative to each other in the three-dimensional space. In particular embodiments, the Editor may provide a user interface allowing designers to specify whether an object is: opaque, transparent/translucent, an overlay, or a cutout. Based on the selected property, the Editor may automatically specify how the corresponding object should be rendered in operation with respect to depth-buffer access.

Further, since AR effects are designed to be displayed in the real world, AR effects are typically defined in 3D space. In particular embodiments, the Editor may provide features that help designers visualize and simulate how augmented reality ("AR") effects appear to users and how they are positioned in three-dimensional ("3D") space. In particular embodiments, the Editor may provide designers simultaneous views of an AR effect from different perspectives, such as through separate windows or display regions. In particular embodiments, the user may update the AR effect through any of the windows and the updates would be reflected in each of the other windows. In particular embodiments, the Editor may be configured to receive gyroscope data from a real mobile device communicatively coupled to the system on which the Editor is being executed, and adjust the orientation and focal plane of the virtual mobile device accordingly. In particular embodiments, an AR effect may be tested using a photo/video sphere overlaid with a video of a person. Moreover, in particular embodiments each AR object in an AR effect may be individually associated with either the display plane of the camera or the 3D space. In particular embodiments, each AR object may be individually configured to be shown with a scene captured by the front camera and/or back camera.

The embodiments disclosed herein only examples, and the scope of this disclosure is not limited to them. Particular embodiments may include all, some, or none of the components, elements, features, functions, operations, or steps of the embodiments disclosed above. Embodiments according to the invention are in particular disclosed in the attached claims directed to a method, a storage medium, a system and a computer program product, wherein any feature mentioned in one claim category, e.g. method, can be claimed in another claim category, e.g. system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim and/or in any combination with any embodiment or feature described or depicted herein or with any of the features of the attached claims.

DESCRIPTION OF EXAMPLE EMBODIMENTS

Figure 1A:
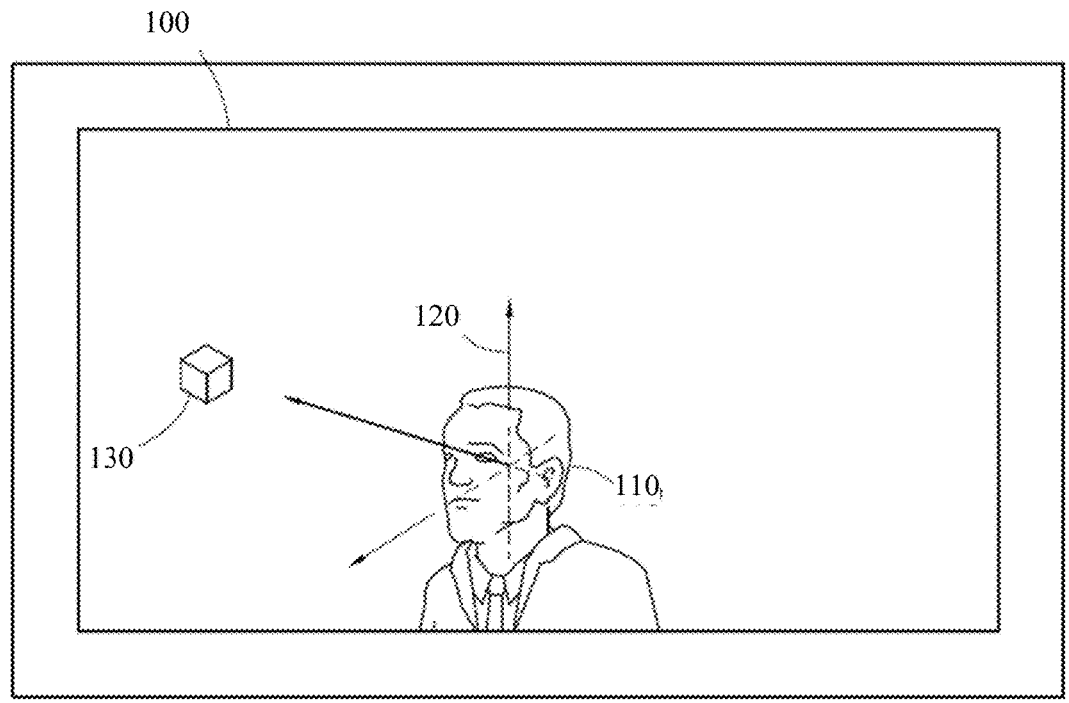
FIGS. 1A-1B illustrate an example user interface of an augmented-reality design editor.

Particular embodiments disclosed herein provide an augmented-reality design editor (hereinafter "Editor") for designing augmented-reality effects. In particular embodiments, the Editor may be a composition and integration tool through which objects may be visually incorporated into an augmented-reality effect and modified based on real-time feedback of the current state of the design. In particular embodiments, the Editor provides a graphical user interface that allows visual editing of the objects and effects in the design.

In particular embodiments, trackers may be added to an augmented-reality design using the Editor. In particular embodiments, a tracker may be a software-implemented tool that may be used in an augmented-reality design to track particular objects and/or motions appearing in a video scene. The Editor may support different types of trackers, such as trackers for a person's face, body, head, hand, expression, and gestures, as well as trackers for other types of animals (e.g., dogs, cats) and objects (e.g., cars, background, wall). The example shown in FIG. 1A utilizes a face tracker 120.

In particular embodiments, the user may add a tracker to an augmented-reality design by, e.g., selecting the desired type of tracker, dragging-and-dropping a tracker onto an object (e.g., a person's face 110) shown in the video 100, or through any other suitable user-input interface. In particular embodiments, based on the type of tracker selected, the Editor may monitor the video for the type of object that the tracker is configured to track (e.g., face, hand, etc.). For example, a 64-point facial rig may be used to detect and track a person's face. In particular embodiments, for each tracker added to the design, the Editor may monitor the entire video display or a region of the video display for the target object. In particular embodiments, upon detecting such an object, the Editor may associate the appropriate tracker with the object to track that object's movements. In particular embodiments, a tracker may tracker any feature(s) of an object, such as movement, position, orientation, color, shape, pattern, etc. In particular embodiments, a tracker may have a fixed position within the video display (e.g., at particular x-y coordinates). As another example, a tracker's position and/or orientation within the video display may be defined relative to the tracked object. For instance, the tracker's position may overlap or coincide with the tracked object and its orientation may mimic that of the tracked object. As another example, a tracker may be positioned n pixels (or other distance measures) from the center of the tracked object and its instantaneous position and/or orientation may depend on the orientation of the tracked object (e.g., if the user is looking up, the tracker may be positioned n pixels above the user's face; if the user is looking forward, the tracker may be positioned n pixels in front of the user's face). This relative position may be maintained as the object moves (e.g., changes position and/or orientation). In particular embodiments, the relative position of a tracker may be defined by the user through a drag-and-drop mechanism using the object shown in the video as the reference point. In particular embodiments, a tracker may also be associated with another tracker. For example, a first face tracker may be positioned n pixels to the left of a person's face, and a second tracker may be positioned m pixels above the first tracker. In particular embodiments, any number of trackers may be added to an augmented-reality design, any number of trackers may be associated with an object, and any number of trackers may be associated with another tracker.

In particular embodiments, a tracker may be displayed in the video to provide visual cues as to the position and orientation of the tracker. For example, a tracker may be displayed as a facial mesh or mask, a three-dimensional Cartesian axis (e.g., the tracker 120 shown in FIGS. 1A and 1B), or any other suitable visual representations. The displayed tracker may move according to movements of the tracked object. For example, as the tracked object changes position and/or orientation, the displayed tracker may change position and/or orientation accordingly (e.g., following the user's face or maintaining a defined relative position; rotating to reflect the orientation of the tracked object, etc.). In the illustrated examples in FIGS. 1A and 1B, the tracker 120 changes its position and orientation according to the changed position/orientation of the person's face 110. In particular embodiments, a display of the tracker may be added to the video in real-time while the video is being displayed. In particular embodiments, the displayed tracker may also be a user interface for changing the position, orientation, and other properties of the tracker and/or any associated objects. For example, the user may drag-and-drop a tracker (e.g., displayed as a three-dimensional Cartesian axis) to adjust the position and/or orientation of the tracker or any associated objects that are defined relative to the tracker.

In particular embodiments, the user may also add any number of objects to the augmented-reality design in real-time while the video is being displayed. In the illustrated examples shown in FIGS. 1A and 1B, the object 130 is a three-dimensional cube. In particular embodiments, the user may import an object definition (e.g., an image file, a 3D object model, etc.) into the Editor (e.g., from a file, server, another application, etc.). For example, an object may be a 2D image, a 3D object, a mask, a mesh, a plane, a line, a null object (e.g., only displayed during the design but not in the final product), or any other visual artifacts. While certain objects may be predefined, others may be dynamically generated based on detected features of the video. For example, a facial mask or mesh may be dynamically generated based on information from a 64-point facial rig so that its size, shape, and/or contour may match that of the detected face. In particular embodiments, the user may select any available object and add it to the augmented-reality design using any suitable user-input interface (e.g., through a menu selection, dragging-and-dropping, etc.). In particular embodiments, the selected object may be rendered and displayed in the video in real-time as the video is being played.

Figure 1B:
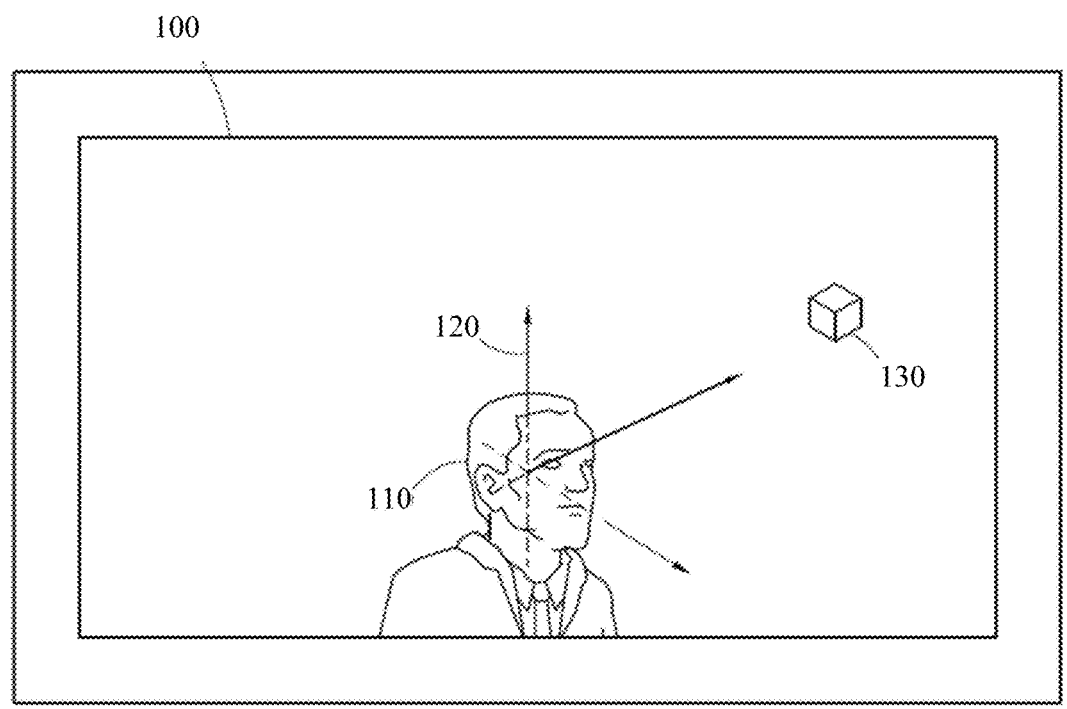

In particular embodiments, the user may associate any number of objects with one or more trackers. For example, in FIGS. 1A and 1B, the object 130 is associated with the tracker 120. In particular embodiments, the Editor may display the selected object in the video in real-time while the video is being displayed. In particular embodiments, the object may move within the video according to the movements of the associated tracker. For example, as the tracker changes position and/or orientation (as a result of movements by the tracked object), the associated object may change position and/or orientation accordingly. In particular embodiments, an object may be attached to a tracker such that the object's position and/or orientation coincides with that of the tracker. For example, a facial mask may follow a user's face based on a facial tracker so that the facial mask appears to be worn by the user. In particular embodiments, an object may have a defined position and/or orientation relative to the associated tracker. For example, FIGS. 1A and 1B show the object 130 maintaining a distance and orientation relative to the tracker 120. In particular embodiments, an object may also be an animation, which may be triggered by certain triggering events detected by an associated tracker. For example, a facial mask object may blink and open its mouth upon the tracker detecting corresponding facial movements by the tracked faced. As another example, augmented tears may be shown flowing out of the user's eyes upon detection of the user making a sad face (e.g., based on detection of a frown or downwardly-curled lips). As yet another example, an object may have a defined movement pattern, such as a ball orbiting around the associated tracker.

In particular embodiments, the Editor may provide various options for editing the augmented-reality design in real time. In particular embodiments, an object may be adjusted directly through the Editor's user interface while it is being displayed in the video. For example, the Editor may allow an object's size, aspect ratio, orientation, position, behavior and other features to be viewed and adjusted. For instance, the user may use a drag-and-drop mechanism to visually adjust an object's size, position, or orientation. Since the object is being displayed while adjustments are made, the designer is provided with constant real-time feedback of how the object appears. In particular embodiments, the Editor may also provide designers the option to edit code associated with behaviors of augmented-reality effects. For example, the Editor may provide a panel through which code (e.g., JavaScript) governing the behavior of effects may be edited. In particular embodiments, code may be edited while the video and associated trackers and objects are being displayed. Once the code has been updated, the user may apply the changes and immediately see how the augmented-reality behaves as a result. In particular embodiments, the Editor may also provide various predefined effect options, such as different types of transition between frames, tracker templates with predetermined positions (e.g., two face trackers with preconfigured positions), interactivity between objects and trackers (e.g., certain predefined facial expressions may trigger certain effects), among others.

Particular embodiments of the Editor described above provide several benefits. For example, by decoupling the definition and functionality of trackers and objects, the Editor provides an intuitive and flexible design methodology that allows augmented-reality effects to be visually designed separately (if desired) from the art work used in the effects.

This in turn simplifies the design process and allows a designer (e.g., a programmer or artist) to independently refine the augmented-reality design. Further, by providing real-time feedback of any modifications, the Editor streamlines the design process since the designer can see and adjust the augmented-reality effect as it is being designed, rather than having to predict how a change would affect the design and separately perform tests to determine whether the modifications have the desired result.

Figure 2:
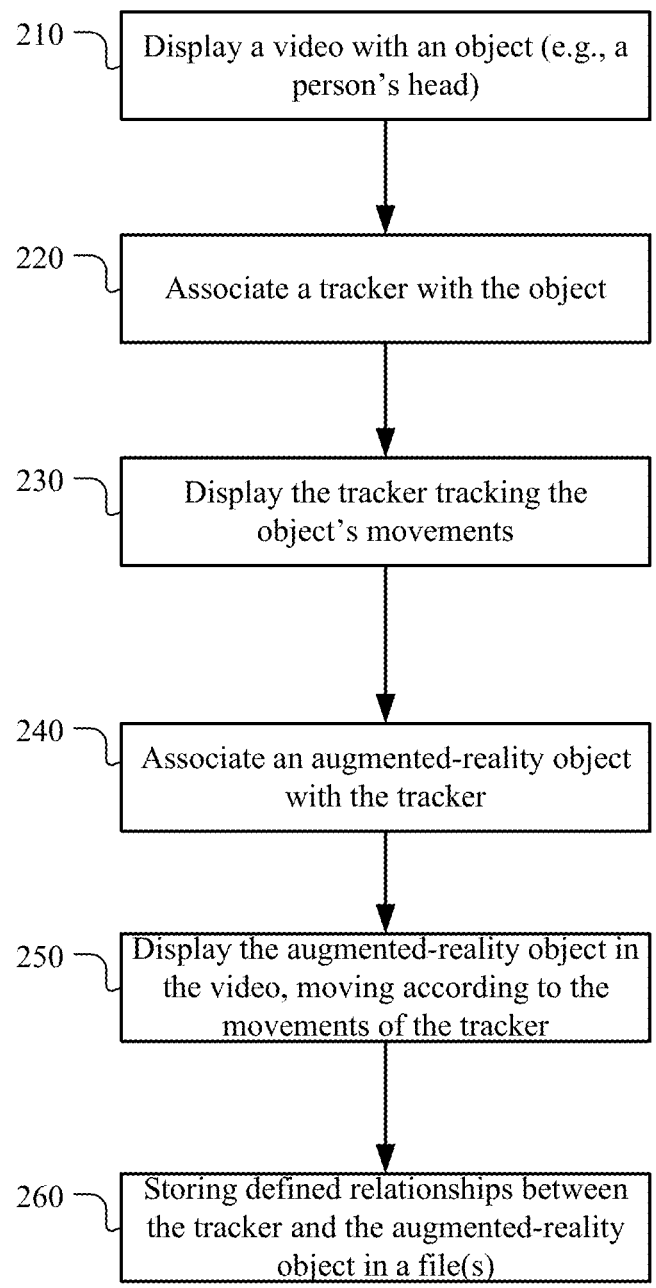
FIG. 2 illustrates an example method for designing an augmented-reality effect using an augmented-reality design editor.

FIG. 2 illustrates an example method 200 for designing an augmented-reality effect using an augmented-reality design editor. In particular embodiments, the method may begin at step 210, where the editor may display a video within a user interface. The video may comprise an object, such as a person's face or head. The video may be displayed in real-time as it is being captured by an optical device. At step 220, a tracker may be associated with the object in response to a first instruction from a user. For example, the user may drag-and-drop an icon designating a tracker onto the object (e.g., a person's face) to instruct the editor to associate a face tracker with the object. As another example, the user may instruct the editor to add a particular type of tracker (e.g., face tracker, hand tracker, etc.) into the augmented reality design. Upon detection of a particular object (e.g., a person's face) in the video, the editor may associate the tracker with that detected object. In particular embodiments, another tracker may be added and associated with the same object. In particular embodiments another tracker may be added and associated with the tracker (e.g., in other words, a tracker that tracks the position/orientation of another tracker). At step 230, the tracker may be displayed in the video. For example, the tracker may provide visual orientation and/or position guidance to reflect the orientation and/or position of the associated object. For instance, the tracker may be displayed as a rendered three-dimensional Cartesian axis, a facial mesh (which may be generated based on a multi-point facial rig of the object), or any other suitable display indicators. In particular embodiments, the tracker may be positioned with the object being tracked. In particular embodiments, the tracker may be positioned separate from the object being tracked. The editor may maintain a relative position and/or orientation of the tracker to the tracked object as the tracked object changes position and/or orientation. In particular embodiments, the user may adjust the position and/or orientation of a tracker relative to the object, which may cause corresponding adjustments to a position/orientation of the associated augmented-reality object relative to the tracked object.

At step 240, an augmented-reality object may be associated with the tracker in response to a second instruction from the user. For example, the user may import from file or select an augmented-reality object (e.g., a three-dimensional or two-dimensional object) and add it to the augmented-reality design. The augmented-reality object may be imported in real-time while the video is being displayed. The augmented-reality object may be associated with the desired tracker so that the object moves dynamically according to data provided by the tracker. The user may specify an association through any conventional means, such as by dragging-and-dropping the augmented-reality object onto the tracker or selecting the desired tracker through a menu interface. Any number of augmented-reality objects may be associated with the same tracker. At step 250, the augmented-reality object may be displayed in the video. For example, the editor may create a composite scene of the video and the augmented-reality object. The augmented-reality object may be configured to move according to movements of the tracker, which in turn may move according to movements of the tracked object. The editor may maintain a relative position and/or orientation of the augmented-reality object to the tracker as the tracker changes position and/or orientation. In particular embodiments, an aspect ratio, a size, a position, or an orientation of the displayed augmented-reality object may be adjustable by the user as the augmented-reality object is being displayed in the video. In particular embodiments, the augmented-reality object may be configured to have certain behaviors (e.g., animation, movement, changes in position, orientation, or color, etc.). In particular embodiments, the behavior may be controlled by programming code (e.g., JavaScript) and may be changed by editing the programming code. In particular embodiments, the code may be edited in real-time while the augmented-reality object is being displayed.

At step 260, one or more defined relationships between the tracker and the augmented reality object may be stored in one or more files. For example, once the design is complete, the designer may save or export the design into a file, which may then be used to cause the augmented-reality effect to be displayed on an end-user's device in operation. In particular embodiments, design instructions from the user (e.g., adding/associating a tracker or augmented-reality object) may be received by the editor in real-time while the video is being displayed, and the tracker and/or augmented-reality object may be added to the video in real-time while the video is being displayed. Thus, the Editor may provide real-time feedback as the designer is designing. Particular embodiments may repeat one or more steps of the method of FIG. 2, where appropriate. Although this disclosure describes and illustrates particular steps of the method of FIG. 2 as occurring in a particular order, this disclosure contemplates any suitable steps of the method of FIG. 2 occurring in any suitable order. Moreover, although this disclosure describes and illustrates an example method for designing an augmented-reality effect using an augmented-reality design editor, including the particular steps of the method of FIG. 2, this disclosure contemplates any suitable method for designing an augmented-reality effect using an augmented-reality design editor, including any suitable steps, which may include all, some, or none of the steps of the method of FIG. 2, where appropriate. Furthermore, although this disclosure describes and illustrates particular components, devices, or systems carrying out particular steps of the method of FIG. 2, this disclosure contemplates any suitable combination of any suitable components, devices, or systems carrying out any suitable steps of the method of FIG. 2.

In particular embodiments, the Editor may define rules and systems to ensure that virtual objects scale to the form factors and aspect ratios of different display devices, and making those rules and systems part of the design/creation process, rather than an afterthought. The embodiments described herein provide systems and user interfaces for specifying various scaling configurations that are intuitive, comprehensive, and flexible. For example, at a high level, the Editor may provide a user interface that allows designers to choose where to anchor an object and specify how its position, orientation, and/or size should respond to different display specifications.

Figure 3A:
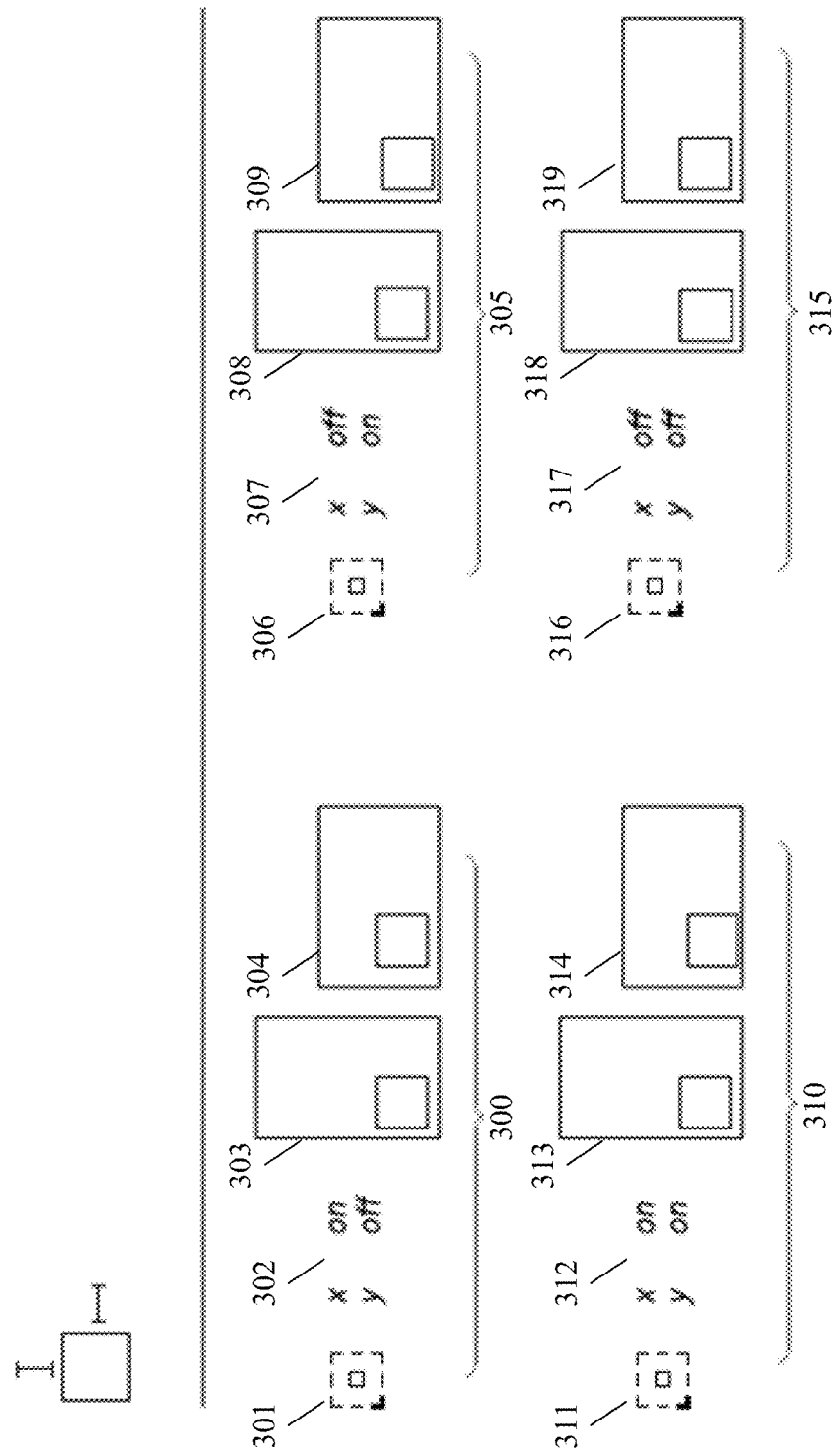
FIGS. 3A-3D illustrate example scaling configurations for an object.

FIG. 3A illustrates example configuration options for an object (e.g., an image) that govern how the object may be positioned in an augmented-reality scene. In particular embodiments, the Editor may display a selectable interface that allows a designer to select an anchor for an object. In particular embodiments, an anchor may define (1) a relative point in the associated object from which distance is measured, and (2) a relative point in the display canvas to which the object is anchored. For example, if a designer selects the lower-left corner as the anchor for an object, the lower-left corner of the 2D canvas used for displaying the object and the lower-left corner of the object may be used as the points from which distance is measured (e.g., for calculating position offsets). In particular embodiments, the user interface for anchor selection may be a polygon (e.g., square) with selectable corners, sides, and/or center. An example of such a user interface is shown in, e.g., FIG. 3A at labels 301, 306, 311, and 316. In the example shown, the lower-left corner is selected to be the object's anchor.

In particular embodiments, the Editor may allow the designer to define a position offset for the object relative to its anchor. In particular embodiments, the position offsets may be specified as an x value and a y value in the display canvas' Cartesian plane (e.g., positive values for upwards and to the right; negative values for downwards and to the left). In particular embodiments, the position offset may be measured from the object's anchor point in the canvas (e.g., bottom-left corner of the canvas) to the anchor point in the object (e.g., bottom-left corner of the image). For example, referring to one example configuration 300 in FIG. 3, where the anchor point 301 is specified to be the bottom-left corner and offset values set to x and y 302, the associated object (the square) is positioned in the canvas (the rectangle) such that the bottom-left corner of the object and the bottom-left corner of the canvas are some distance apart (see, e.g., 303). In this example, the position of the object's bottom-left corner is determined based on the position of the bottom-left corner of the canvas, offset by the specified x and y values. If instead the anchor is defined to be, e.g., the center, the center point of the object would be determined based on the center point of the canvas, offset by x and y. This general principal applies to other anchor selections as well.

In particular embodiments, position offsets may be fixed or responsive. In this context, fixed position offsets means that the position offset does not depend on display region's dimensions. For example, configuration 315 shown in FIG. 3 provides an example where the x and y offsets 317 are both fixed (indicated by "off" in this example), with the anchor 316 being set as the bottom-left corner. Since the position offsets are fixed, the object (square) is positioned in equal distance from the bottom-left corner of the canvas (rectangle) regardless of whether the canvas is in portrait mode 318 (e.g., height is longer than width) or landscape mode 319 (e.g., height is shorter than width). In particular embodiments, fixed position offsets may be specified in units of length, such as density-independent pixel, pixel, and metric units. In particular embodiments, instead of entering the specific x and y offsets, the designer may use a visual design interface to drag-and-drop the object to a desired location, and the Editor would automatically determine the corresponding position offset from the specified anchor.

In particular embodiments, position offsets may be responsive, thus making them dependent on the display region's dimensions. In particular embodiments, responsive position offsets may be specified in percentages, ratios, proportions, and any other measurements of relative length. In particular embodiments, rather than manually inputting the responsive position offset, the designer may use a visual design interface to place the object at a desired position, and the Editor would automatically determine the corresponding position offset based on the specified anchor and the dimensions of the display region. In particular embodiments, the x responsive position offset may be the ratio of (1) the distance in the x-axis between the object's anchor point and the display region's anchor point, to (2) the display region's x-axis length (e.g., the width). For example, if the width of the display region is 100 density-independent pixels (dp) in length and the x-axis responsive position offset is 10%, the bottom-left point of the object (the anchor position) would be located 10 dp (i.e., 10% of 100 dp) to the right of the bottom-left corner of the display region. When the width of the display region is increased to, e.g., 200 dp (e.g., when the device switches from portrait to landscape mode), the bottom-left point of the object would then be located 20 dp (i.e., 10% of 200 dp) to the right of the bottom-left corner of the display region.

Similarly, the y responsive position offset may be the ratio of (1) the distance in the y-axis between the object's anchor point and the display region's anchor point, to (2) the display region's y-axis length (e.g., the height). Configuration 310 shown in FIG. 3 provides an example where the x and y offsets 312 are both responsive (indicated by "on" in this example), with the anchor 311 being set as the bottom-left corner. When the display region is in portrait mode as shown in 313, the x and y distances between bottom-left corner of the object and the bottom-left corner of the display region appears roughly equal. However, in landscape mode 314 the x-axis distance between the bottom-left corners of the object and display region is greater than the corresponding x-axis distance in portrait mode 313, because the width of the display region increased in landscape mode while the x-axis responsive position offset remained at the same percentage (e.g., 10%). Similarly, in landscape mode 314 the y-axis distance between the bottom-left corners of the object and display region is less than the corresponding y-axis distance in portrait mode 313, because the height of the display region decreased in landscape mode while the y-axis responsive position offset remained at the same percentage (e.g., 10%). In particular embodiments, the x and y responsive position offsets need not both be the same type. For example, configuration 300 shows the x-axis offset being responsive ("on") and the y-axis offset being fixed ("off"), and configuration 305 shows the x-axis offset being fixed ("off") and the y-axis offset being responsive ("on"). In particular embodiments, the designer may toggle a position offset between fixed and responsive. In response, the Editor may perform automatic unit conversions based on the current dimensions of the display region.

Figure 3B:
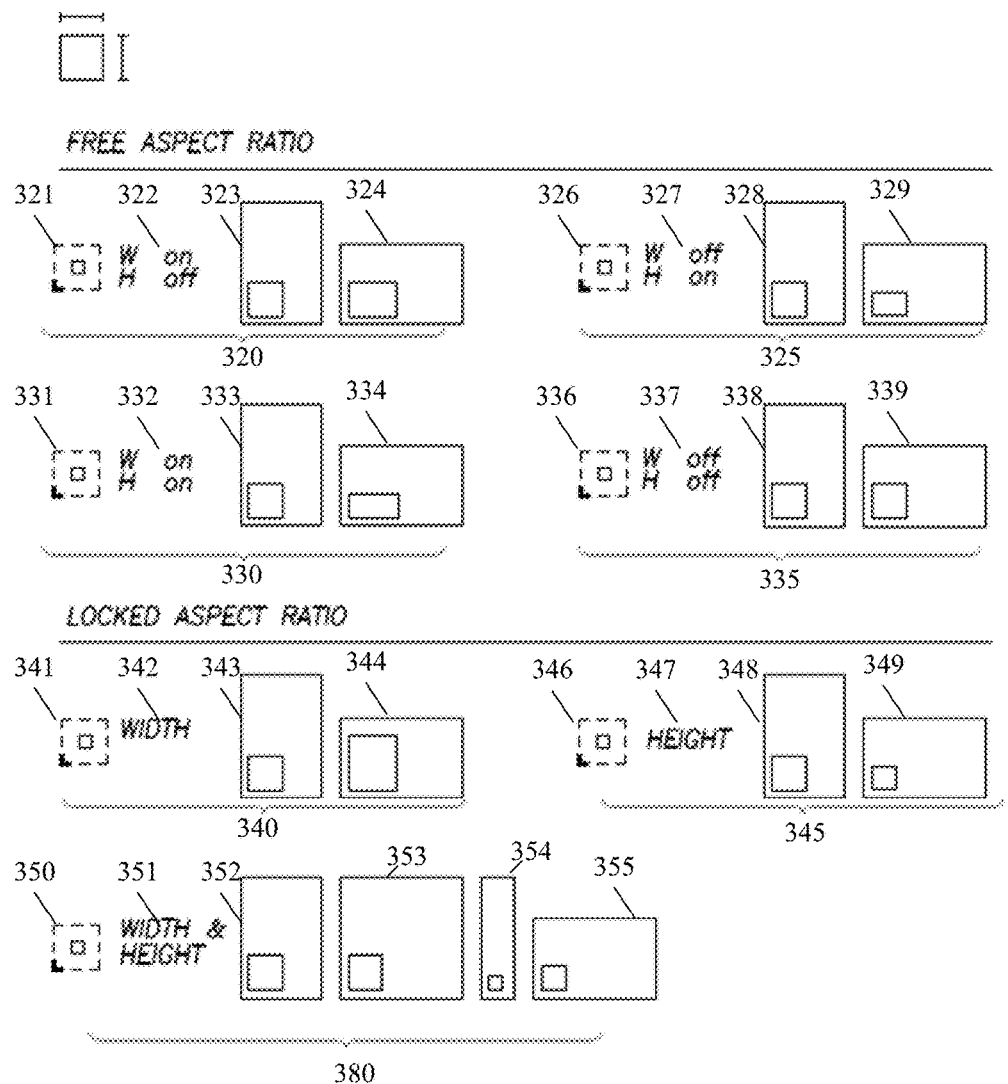

FIG. 3B illustrates example configuration options for an object that may govern how the object may be sized in an augmented-reality scene. In particular embodiments, the aspect ratio of the object may not be fixed, as shown by the example configurations 320, 325, 330, 335. Because the aspect ratio is not fixed, the height and width of the objects may be independently altered, which may result in changes to the overall shape of the object (e.g., the objects shown in 324, 329, and 334 became rectangles). In particular embodiments, the size of the object may be adjusted relative to an anchor point 321, 326, 331, 336, which may be specified as described above. For example, if the anchor point is set to be the bottom-left corner, the other three corners in the rectangle may be computed from that corner using the specified height and width values 322, 327, 332, 337.

In particular embodiments, the height and width of the object may be independently set as either fixed or responsive. In the configuration 335 where both the height and width are 337 are fixed (indicated by "off"), the height and width may not be dependent upon the dimensions of the display region in particular embodiments. For example, the objects (square) are the same in the portrait view 338 and landscape view 339. However, in the configuration 330 where both the height and width 332 are responsive (indicated by "on"), these values may represent a proportion of the object's height and width to the height and width of the display region, respectively. For example, the actual height of the object may be computed by multiply the responsive height proportion (e.g., 33% or ⅓) with the current height of the display region. For instance, if the height of the display region in portrait mode 333 is 100 dp, then the height of the object may be 33 dp (i.e., ⅓×100 dp). When the display region switches from portrait mode 333 to landscape mode 334, its height may decrease (e.g., to 60 dp), which may in turn cause the object's height to decrease to 20 dp (i.e., ⅓×60 dp). Similarly, the actual width of the object may be computed by multiplying the responsive width proportion (e.g., 50% or ½) with the current width of the display region. For instance, if the width of the display region in portrait mode 333 is 60 dp, then the width of the object may be 30 dp (i.e., ½×60 dp). When the display region switches from portrait mode 333 to landscape mode 334, its width may increase (e.g., to 100 dp), which may in turn cause the object's width to increase to 50 dp (i.e., ½×100 dp).

In particular embodiments, the height and width of the object may be individually set as fixed or responsive. For example, configuration 320 shown an example where the width is responsive and the height is fixed, and configuration 325 shows an example where the width if fixed and the height is responsive. In particular embodiments, when the width or height is toggled from one type to another (e.g., fixed to responsive or vice versa), the Editor may automatically convert a specified measurement unit to the other measurement unit using the current dimensions of the display region (e.g., from fixed measurements of length to responsive proportion, or vice versa).

In particular embodiments, the aspect ratio of the objects may be locked, as shown by the example configurations 340, 345, 380. Because the aspect ratio is fixed, the overall shape of the object would remain the same even when the height and/or width of the object changes due to changes in the dimensions of the display region (e.g., the object remains a square in 344, 349, 353, 354, 355). In particular embodiments, the dimensions of the object with locked aspect ratio may be governed by width, height, or both. For example, in the configuration 340 where the object's size is dictated by responsive scaling of its width 342, when the width of the display region increases (e.g., from 60 dp to 100 dp), the width of the object may also increase (e.g., from 30 dp to 50 dp, if the responsive width is set at 50%). In turn, the height of the object may be set to 50 dp as well, since the aspect ratio of a square is 1:1. Consequently, the square object in portrait mode 343 may be enlarged in landscape mode 344. As another example, in the configuration 345 where the object's size may be dictated by responsive scaling of its height 347, when the height of the display region decreases, (e.g., from 100 dp to 60 dp), the height of the object may also decrease (e.g., from 33 dp to 20 dp, if the responsive height is set at 33%). This in turn may cause the width of the object to be 20 dp in order to maintain the aspect ratio of 1:1. Consequently, the square object in portrait mode 348 may become smaller in landscape mode 349.

In particular embodiments, the object's size may be dictated by responsive scaling of either height or width, in which case the object may scale conservatively. An example of this is shown in configuration 380, where sizing is based on both width and height 351. As shown in 352, the responsive width may be 50% and the responsive height may be 33%. If the width of the display region increases but its height remains the same, as shown in 353, the Editor may recognize that the object's size may increase if responsive scaling is based on width, and that the object's size may not change if responsive scaling is based on height. If the Editor scales conservatively, the smaller size may be adopted; on the other hand, if the Editor scales aggressively, the larger size may be adopted. As another example, if the width of the display region decreases while its height remains the same, as shown in 354, the Editor may recognize that the object's size may decrease if responsive scaling is based on width, and that the object's size may not change if responsive scaling is based on height. However, in this example the original size of the object may not fit in the new display region. This is why in particular embodiments it may be preferable to scale conservatively (i.e., adopting the smaller size). In an example where the display region's height decreases and its width increases, as shown in 355, the Editor may compute the size and width of the object and compare them. For example, if the display region shown in 355 has a height of 60 dp and a width of 100 dp, the object's height may be 20 dp (i.e., 33%×60 dp) and its width may be 50 dp (i.e., 50%×100 dp). In particular embodiments where the smaller size is adopted, the Editor may resize the object to have sides of 20 dp.

Figure 3C:
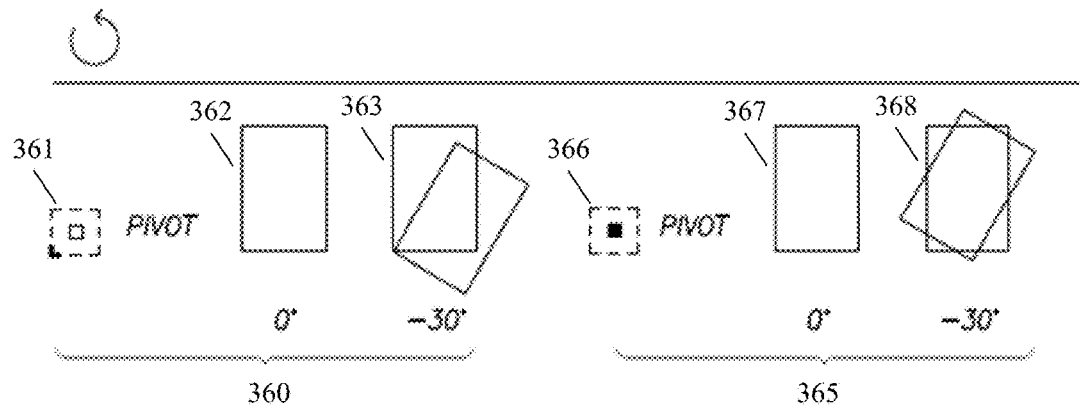

FIG. 3C illustrates example configuration options for an object that govern how the object may be rotated in an augmented-reality scene. In particular embodiments, the user may select a pivot point around which the object may rotate. In particular embodiments, the user interface for selecting the pivot point may be similar to that of an anchor selection interface, as previously discussed. For example, in configuration 360, the pivot point 361 is defined to be the bottom-left corner of the object. Thus, when the object 362 rotates −30°, the rotation pivots around the bottom-left corner of the object, as shown in 363. As another example, in configuration 365, the pivot point 366 is defined to be at the center of the object. Thus, when the object 367 rotates −30°, the rotation pivots around object's center, as shown in 368. In particular embodiments, the designer may input a specific degree of rotation and/or use a drag-and-drop interface to visually rotate the object.

Figure 3D:
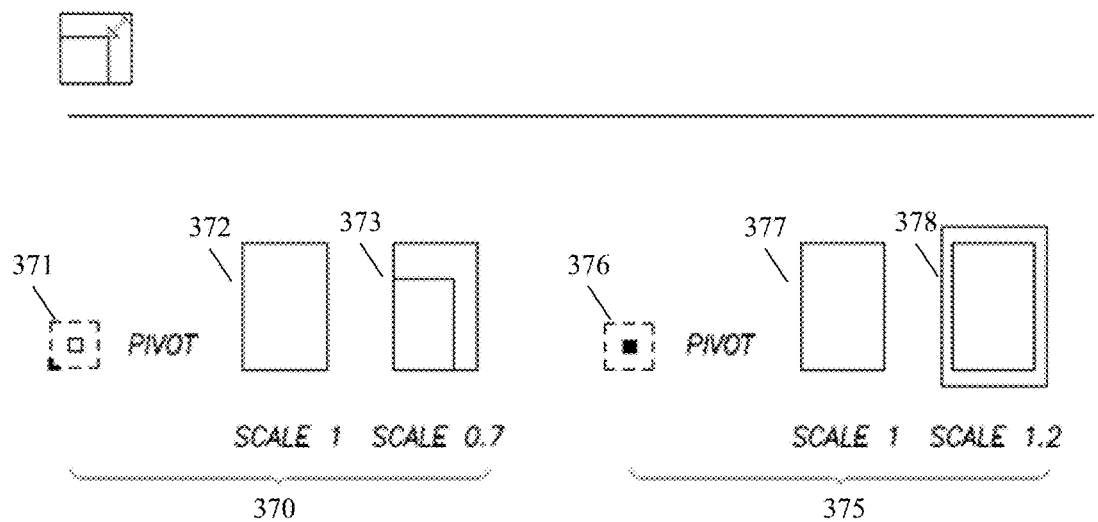

FIG. 3D illustrates example configuration options for an object that govern how the object may be scaled in an augmented-reality scene. In particular embodiments, the designer may specify a scaling factor to adjust the size of the object without changing its shape. In particular embodiments, the user may select a pivot or scaling point from which the scaling extends. In particular embodiments, the user interface for selecting the scaling point may be similar to that of an anchor selection interface, as previously discussed. For example, in configuration 370, the scaling point 371 is defined to be the bottom-left corner of the object. When the object 372 (showing the normal scale of the object) is scaled by a factor of 0.7, its size may be reduced, as shown in 373. Because the scaling point is defined to be the bottom-left corner in this case, the new object's bottom-left corner did not change position; only the other three corners changed positions. As another example, in configuration 375, the scaling point 376 is defined to be the center of the object. When the object 377 (showing the normal scale of the object) is scaled by a factor of 1.2, its size may be enlarged, as shown in 378. Because the scaling point is at the center, the new object's center remains in the same position.

Figure 4:
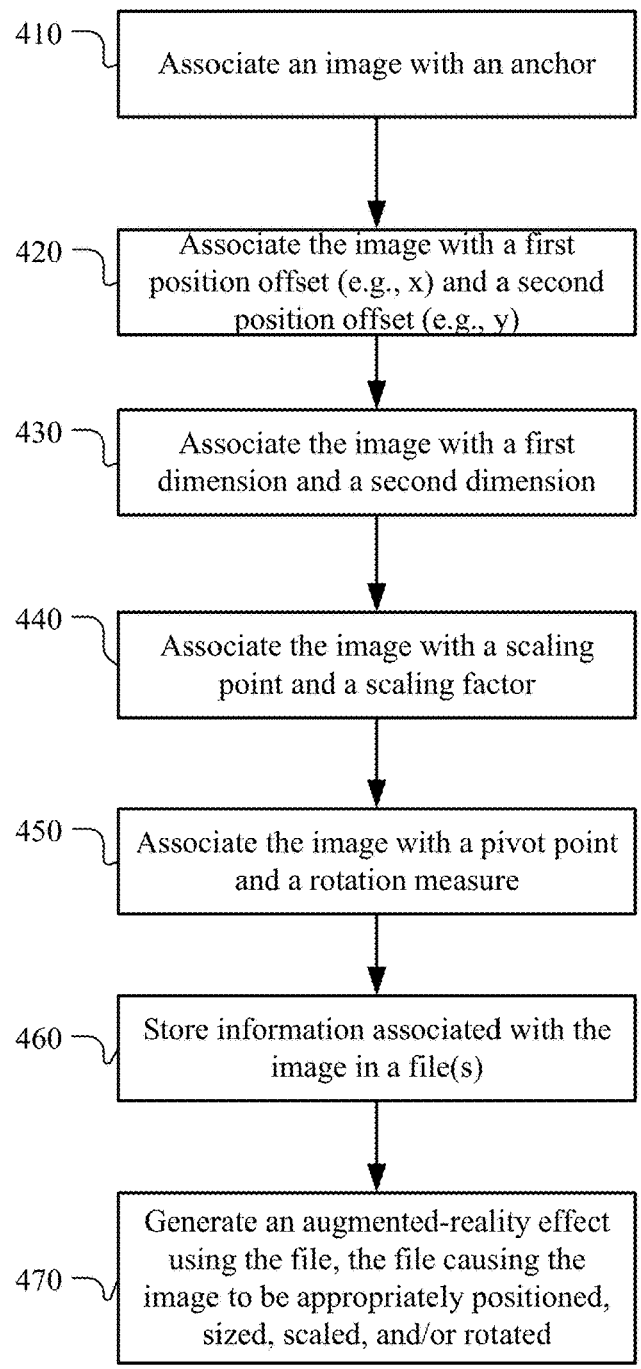
FIG. 4 illustrates an example method for specifying scaling configurations for an object using an augmented-reality design editor.

FIG. 4 illustrates an example method 400 for specifying scaling configurations for an object using an augmented-reality design editor. The method may begin at step 410, where the editor may associate an image with an anchor positioned specified by a user. The anchor position may define a first relative point in the image and a second relative point in a first display region for displaying the image. In particular embodiments, the points in the image and display regions may correspond to the position defined by the anchor position. For example, if the anchor position is selected to be the bottom-left corner, the bottom-left corner of the image may be a first relative point and the bottom-left corner of the display region may be a second relative point. As another example, if the anchor position is selected to be the center, the center of the image may be a first relative point and the center of the display region may be a second relative point. In particular embodiments, the anchor position may be selected from a plurality of predetermined anchor positions, comprising a corner (e.g., bottom-left, bottom-right, top-left, top-right), a side (e.g., left, right, top, bottom), or a center.

At step 420, the image may be associated with a first position offset (e.g., in the x direction) and a second position offset (e.g., in the y direction). In particular embodiments, the first position offset may be used to define a first position of the image relative to the display region based on the first relative point in the image and the second relative point in the first display region. In particular embodiments, the first position offset may define a relative separation between the first relative point in the image and the second relative point in the first display region in an x-axis or a y-axis of a display plane of the first display region. For example, assuming the anchor position is defined to be the bottom-left corner and the bottom-left corner of the display region is positioned at coordinates (0, 0) in Cartesian space. If the position offsets for an object are (3, 5), the bottom-left corner of the object, when rendered, may have coordinates (3, 5). If instead the bottom-left corner of the display region is positioned at coordinates (5, 5), then the bottom-left corner of the object may instead have coordinates (8, 10). In particular embodiments, the position offsets (e.g., x and y offsets) may be individually set as a fixed offset (e.g., measured in a unit of length, such as pixels, density-independent pixels, inches, centimeters, etc.) or a responsive offset (e.g., specified as a proportion). For example, one of the offsets (e.g., the x-axis) may be fixed, and the other (e.g., y-axis) may be responsive. As another example, both offsets may be fixed or both may be responsive. In particular embodiments, the editor may initially receive a fixed positioned offset specified as a unit of length by the user, and upon receiving a user instruction to change the offset from being fixed to responsive, automatically convert it into a responsive offset based on a proportion of the fixed position offset to a dimension of the first display region. For example, if the fixed offset is 5 dp and the x-dimension of the display region is 100 dp, the fixed 5 dp offset may be converted into a 5/100 or 1/20 responsive offset. As another example, if a current responsive x-dimension offset is 1/100 and the x-dimension of the display region is 200 dp, the converted fixed offset may be 2 dp (based on the 1/100 responsive offset multiplied by the 200 dp dimension of the display region).

At step 430, a first dimension and a second dimension specified by the user may be associated with the image. For example, the first dimension and the second dimension may be the desired length and width of the image. In particular embodiments, the first and second dimensions may be individually set as being fixed or responsive. For example, one of the dimensions may be fixed (e.g., measured in units of length) and the other may be responsive (e.g., measured in proportion), or both may be fixed or responsive. In particular embodiments, the editor may initially receive a fixed dimension specified as a unit of length by the user, and upon receiving a user instruction to change the dimension from being fixed to responsive, automatically convert it into a responsive dimension based on a proportion of the fixed dimension to a dimension of the first display region. For example, if the x-dimension of the image is 50 dp and the x-dimension of the display region is 100 dp, the fixed 50 dp x-dimension may be converted into a 50/100 or ½ responsive dimension. As another example, if a current responsive x-dimension is 40/100 and the x-dimension of the display region is 200 dp, the converted fixed x-dimension may be 80 dp (based on the 40/100 responsive dimension multiplied by the 200 dp dimension of the display region). In particular embodiments, the aspect ratio of the image may be locked or unlocked in response to a selection by the user.

At step 440, the editor may associate the image with a scaling point and a scaling factor. For example, if the scaling point is defined to be the bottom-left corner of the image, then that point of the image before scaling may be in the same position as the point of the image after scaling. As another example, if the scaling point is defined to be the bottom side of the image, then the mid-point of the bottom side of the image before and after scaling may remain at the same position, regardless of how it is scaled.

At step 450, the editor may associate the image with a pivot point and a rotation measure (e.g., measured in degrees). For example, if the pivot point is defined to be the bottom-left corner of the image, then that point of the image prior to any rotation may be shared by the pivoted/rotated version of the image. In other words, the image is rotated relative to the pivot point.

At step 460, the editor may store information associated with the image, such as the associated anchor position, position offsets, sizing dimensions, scaling point, scaling factor, pivot point, rotation measure, and/or other associated information in one or more files.

At step 470, the stored files may be configured to generate an augmented-reality effect and cause the image to be displayed at a second position in a second display region (e.g., on an end-user device). For example, an augmented-reality rendering engine may access the file and be instructed to render an augmented-reality effect accordingly. In particular embodiments, the anchor position may define a relative point in this second display region, such as its bottom-left corner. In particular embodiments, the position offsets may be used to define the second position of the image relative to the second display region based on the first relative point in the image and the third relative point in the second display region. For example, continuing the example provided above with respect to step 420, if the anchor is defined to be the bottom-left corner and the position offsets are defined to be (3, 5), then the position of the image relative to the display region of the end-user device may be computed based on the bottom-left corner of the image and the bottom-left corner of the end-user's display region. For example, if the end-user's display region is positioned at (0, 0), then the bottom-left corner of the image may be positioned at (3, 5). If the display region is instead positioned at (2, 2), then the image may be positioned at (5, 7). If instead the x-dimension offset is a responsive proportion, such as 1/100, and the x-dimension of the end-user's display region is 500 dp, the converted fixed offset may be 5 dp (based on the 1/100 responsive offset multiplied by the 500 dp dimension of the display region). In particular embodiments, the size of the image may be determined based on the first dimension, the second dimension, and whether the aspect ratio of the image if locked. In particular embodiments, the image may be scaled according to the scaling factor from the specified scaling point. In particular embodiments, the image may be rotated based on the rotation measure (e.g., in degrees) and relative to the pivot point.

Particular embodiments may repeat one or more steps of the method of FIG. 4, where appropriate. Although this disclosure describes and illustrates particular steps of the method of FIG. 4 as occurring in a particular order, this disclosure contemplates any suitable steps of the method of FIG. 4 occurring in any suitable order. Moreover, although this disclosure describes and illustrates an example method for specifying scaling configurations for an object using an augmented-reality design editor including the particular steps of the method of FIG. 4, this disclosure contemplates any suitable method for specifying scaling configurations for an object using an augmented-reality design editor, including any suitable steps, which may include all, some, or none of the steps of the method of FIG. 4, where appropriate. Furthermore, although this disclosure describes and illustrates particular components, devices, or systems carrying out particular steps of the method of FIG. 4, this disclosure contemplates any suitable combination of any suitable components, devices, or systems carrying out any suitable steps of the method of FIG. 4.

Figure 5A:
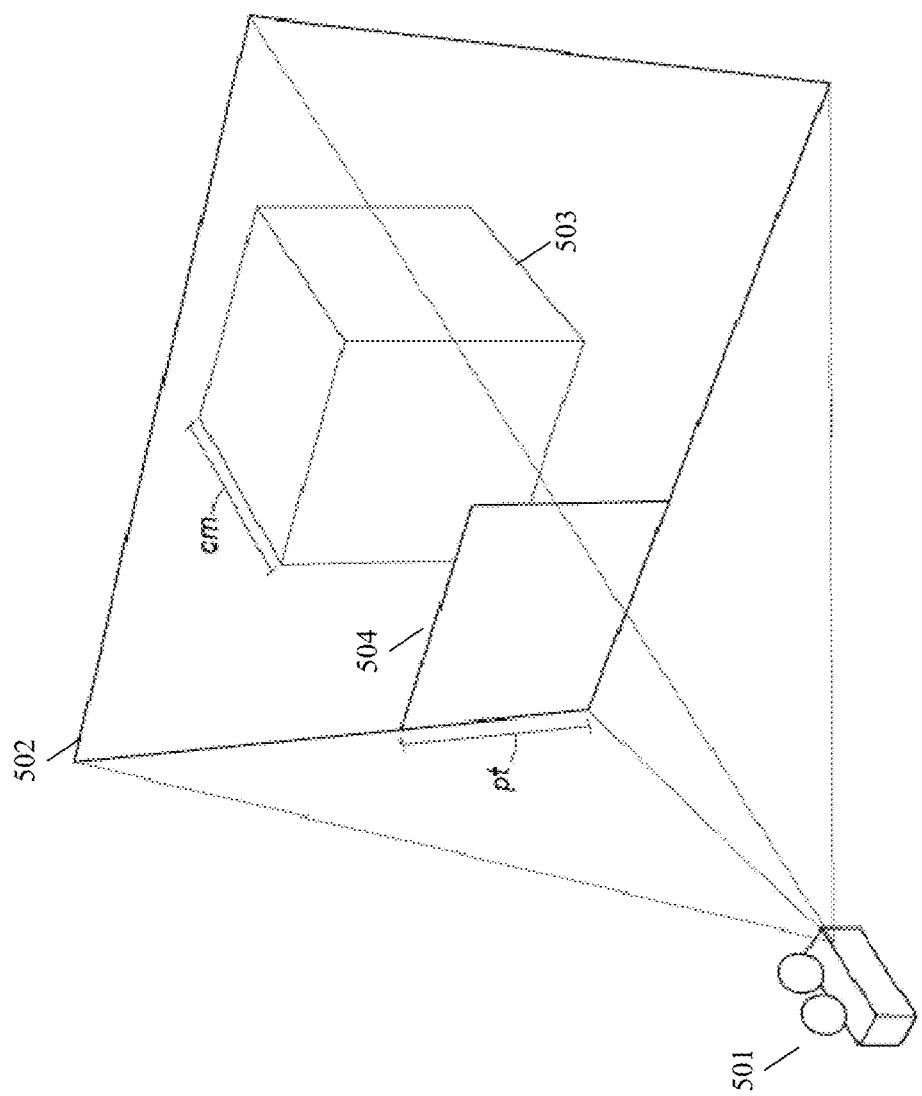
FIG. 5A illustrates an example of a conceptual relationship between a display region, a three-dimensional space displayed through the display region, and a viewer.

FIG. 5A illustrates an example of a conceptual relationship between a display region, a three-dimensional space displayed through the display region, and a viewer. In particular embodiments, the viewer may be represented by a camera 501. In particular embodiments, the camera 501 may be positioned at a particular distance from a display region or canvas 502. For example, the display region or canvas 502 may be a mobile device's display screen or a portion thereof. In particular embodiments, a three-dimensional space may be viewable through the display region 502. For example, the three-dimensional space may be defined such that it comprises an object 503. The object 503 may be, e.g., a three-dimensional object (e.g., a cube, as illustrated), a plane, a line, smoke particles, rays of light, a person, a tree, or any other object. In particular embodiments, displaying a scene of the three-dimensional space may comprise projecting visible objects within the space onto the two-dimensional display region 502. As an example, portions of the cube 503 visible to the viewer 501, such as the surface facing the viewer 501, may be projected onto the display region 502 as a square 504. In particular embodiments, the Editor may present the augmented-reality design in the manner shown in FIG. 5A to simultaneously show the objects as they appear in three-dimensional space and on the two-dimensional canvas.

In particular embodiments, the Editor may provide a system for measuring and representing objects in augmented reality to address the challenges of having both two-dimensional ("2D") and three-dimensional ("3D") objects, real and virtual, together in a scene. In particular embodiments, different measuring systems may be used for 2D and 3D objects to address their unique needs. For example, 3D virtual objects may need to look as if they belong in a real-world scene, such as placing a 3D virtual hat on a real person's head. Thus, in particular embodiments it may be useful to measure 3D objects in real-world units, such as in centimeters and/or inches. One potential advantage of this is that it allows designers to create three-dimensional objects according to real-world scales, since augmented-reality objects may often be displayed with real-world objects. In particular embodiments, 2D projections (e.g., 504) onto the display region 502 may be measured in pixels or density-independent pixels. Doing so may facilitate certain display calculations, including, e.g., rescaling the objects shown to accommodate different dimensions of the display region 502.

Figure 5B:
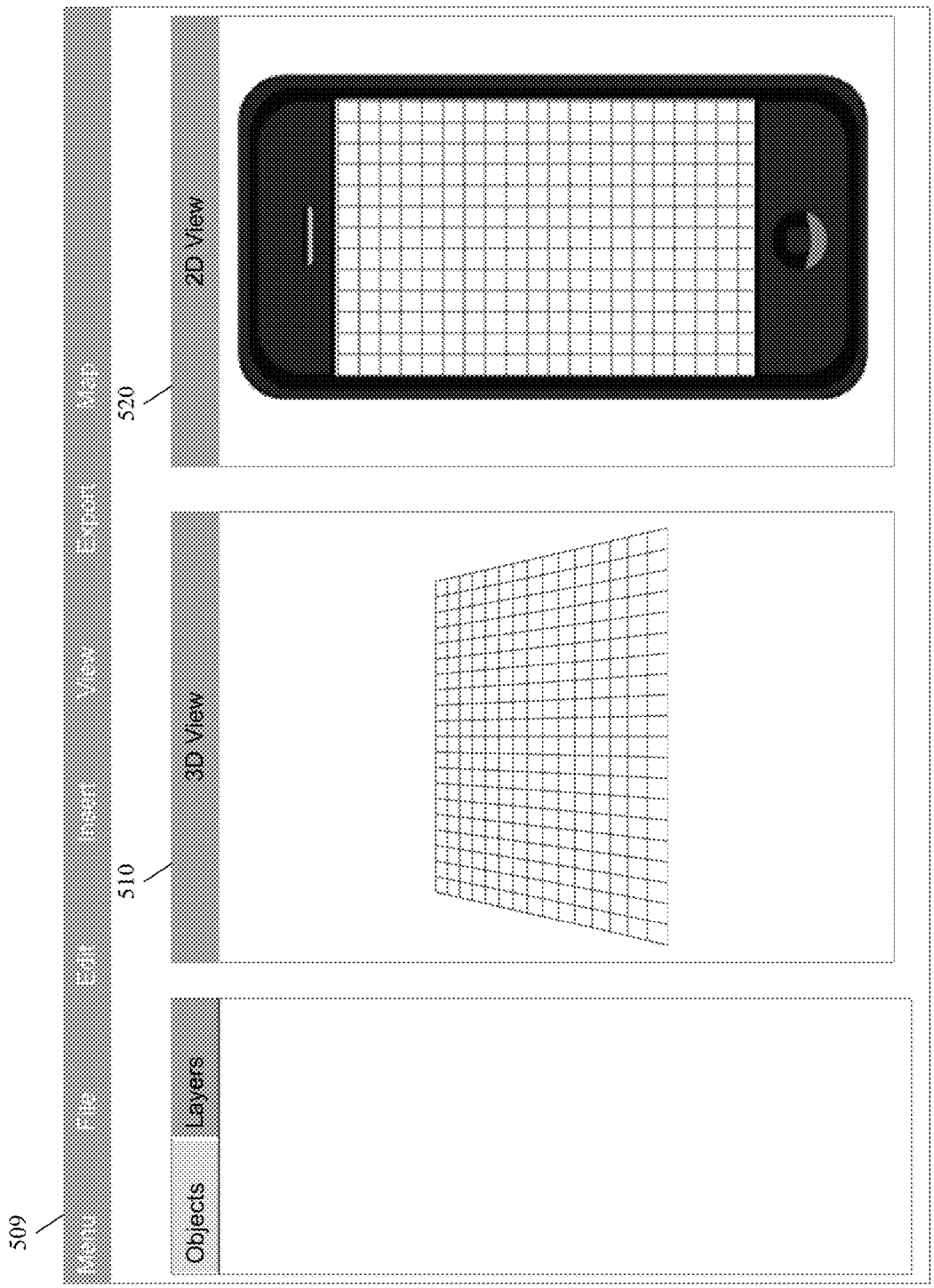
FIGS. 5B and 5C illustrate example user interfaces for concurrently showing how objects may appear in three-dimensional space and in a two-dimensional display region.

FIG. 5B illustrates an example user interface for concurrently showing how objects appear in three-dimensional space and in a two-dimensional display region. As discussed above, designing augmented-reality effects may involve defining objects in three-dimensional space and projecting the objects onto a display region. How an object appears in three-dimensional space may not necessarily achieve the desired effect once it is shown in the display region. Conversely, designing a three-dimensional effect based on how the effect appears in the two-dimensional display region may not provide designers with the appropriate perspective, especially in designs where objects interact with each other and/or with real-world objects in three-dimensional space. Thus, in particular embodiments, the Editor may provide a design interface that concurrently shows how an augmented-reality effect appears in three-dimensional space and two-dimensional space. In particular embodiments, the Editor 509 may provide a three-dimensional display region 510 for displaying objects in three-dimensional space. In particular embodiments, the three-dimensional display region 510 may display a three-dimensional grid to provide visual guidance on how objects in the scene are oriented. In particular embodiments, the Editor 509 may concurrently provide a two-dimensional display region 520 for displaying a scene of the three-dimensional space shown in the three-dimensional display region 510. The scene, for example, may be a viewable portion of the three-dimensional space as seen through a display screen or canvas. In particular embodiments, the two-dimensional display region 520 may be considered as a simulator view for showing how the effect would appear to an end user. In particular embodiments, the two-dimensional display region 520 may be shown as a screen of a mobile phone, laptop, tablet, or any other display device. In particular embodiments, the two-dimensional display region 520 may display a two-dimensional grid to provide visual guidance on object placement. In particular embodiments, as the designer alters a design (e.g., change the position, size, or orientation of an object) through the three-dimensional display region 510, the changes may be reflected in the other display region(s) in the appropriate view, such as the two-dimensional display region and/or the other three-dimensional display regions. In particular embodiments, the design may also be altered through the two-dimensional display region, and the changes may be reflected in the other three-dimensional display regions. This advantageously allows the designer to concurrently view and adjust augmented-reality effects in both three-dimensional and two-dimensional views.

Figure 5C:
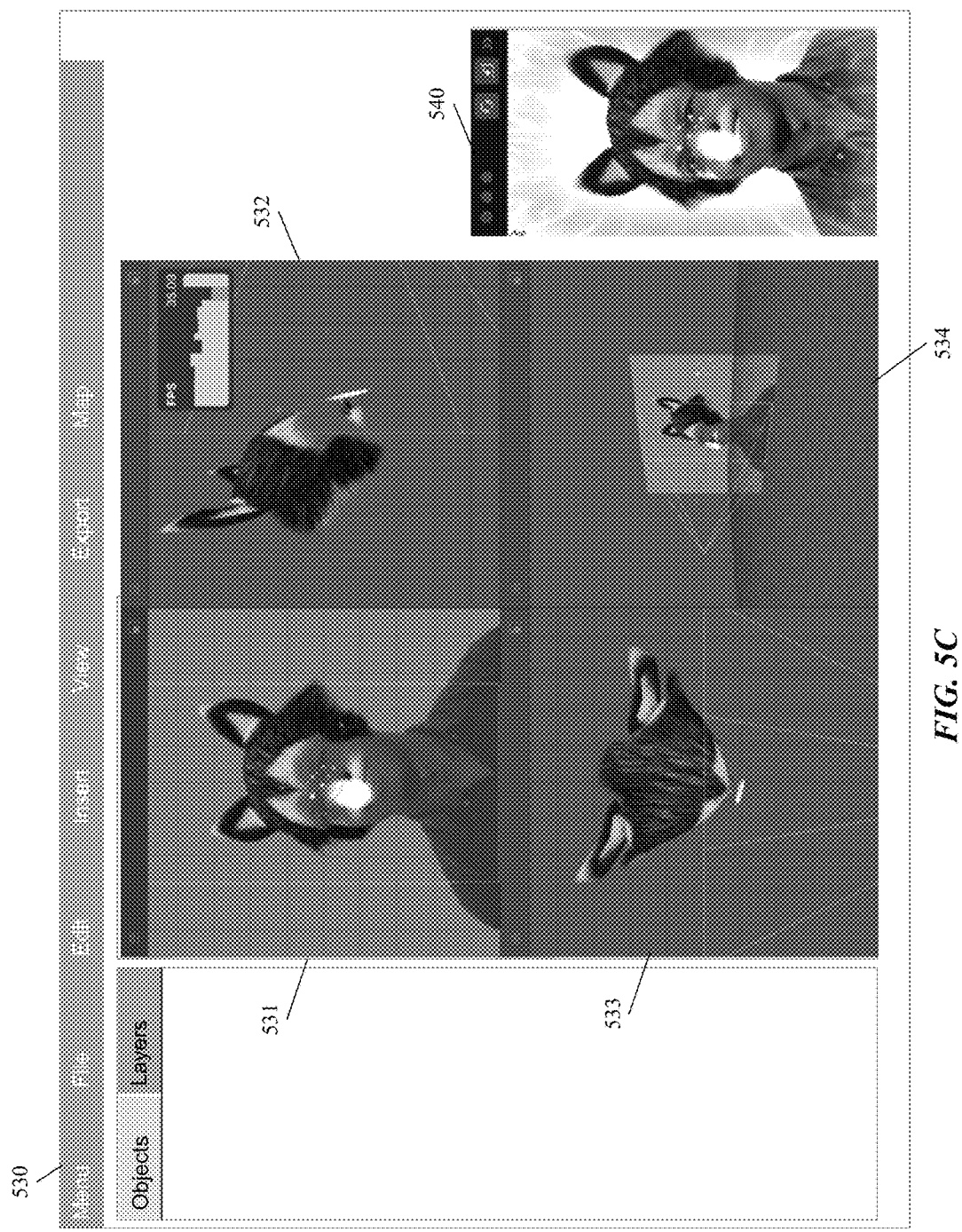

FIG. 5C illustrates an embodiment of the Editor 530 configured to concurrently display scenes defined in three-dimensional space from different perspectives. The Editor 530 may support any number of display regions, each independently configurable to display a scene in the three-dimensional space from a specified perspective (e.g., front, back, top, bottom, left, right, and perspective views). In the example shown, the Editor 530 may concurrently display four three-dimensional display regions. Display region 531 shows a front view of an object (e.g., an animal mask) defined in three-dimensional space. Display region 532 provides a left-side view, display region 533 provides a top view, and display region 534 provides a perspective view. In particular embodiments, each of these display regions may be individually configured to display a scene from a particular perspective. In particular embodiments, a two-dimensional display region 540 may provide a simulation view of how the augmented-reality effect would appear to an end user. In particular embodiments, edits made through any of these display regions 531, 532, 533, 534 may be dynamically reflected in the other display regions (including the simulation region 540).

Figure 6:
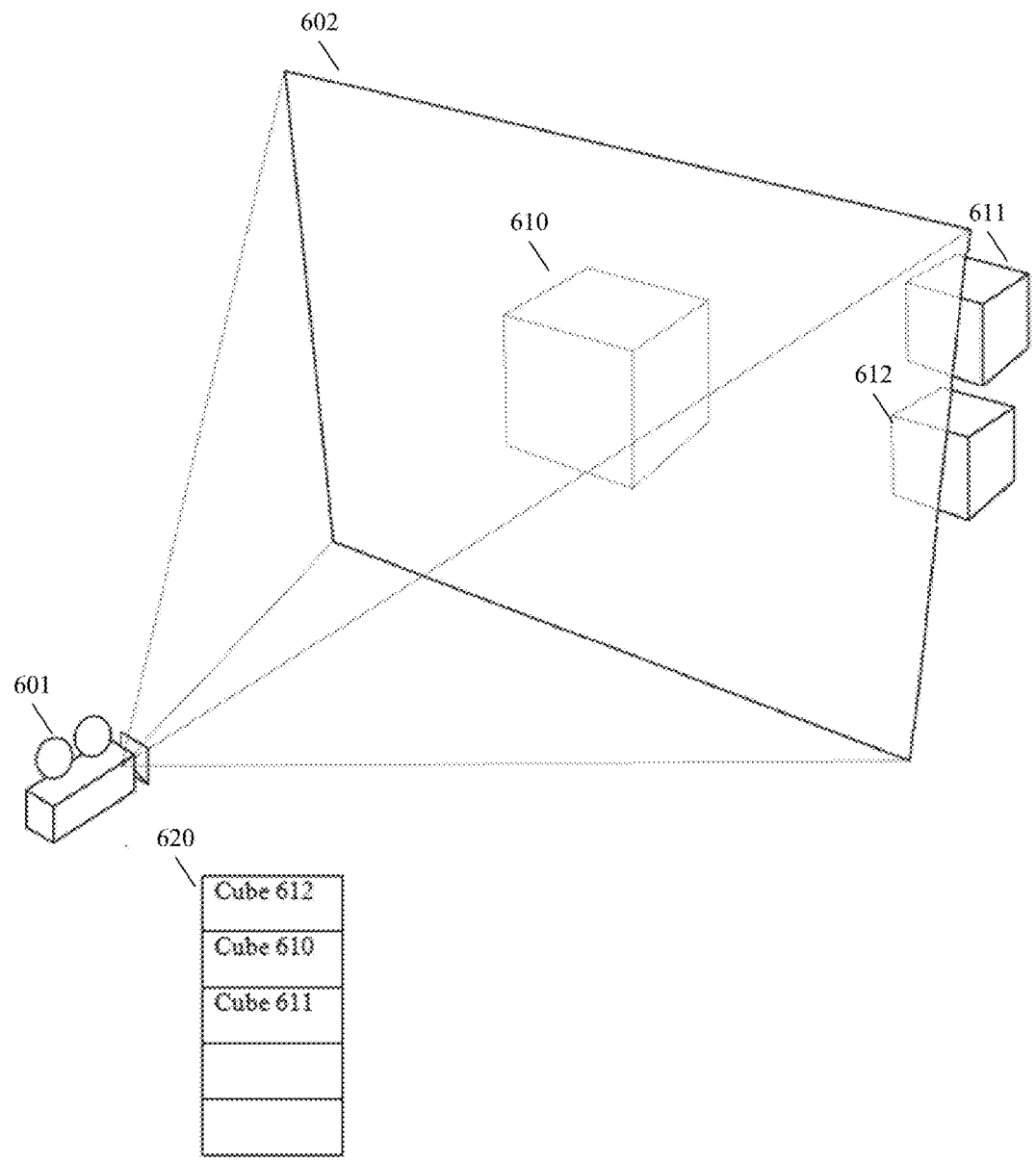
FIG. 6 illustrates an example user interface for controlling the rendering order of objects.

FIG. 6 illustrates an example user interface for controlling the rendering order of objects. In particular embodiments, objects defined in three-dimensional space may be rendered to produce a visual effect. In particular embodiments, the rendering process may be performed by the Editor to provide a preview of the scene. In particular embodiments, once the design is complete, the three-dimensional model may be stored (e.g., as a file) and used by an end-user device (e.g., mobile phone) to render the augmented-reality effect in operation. Since objects may be hidden behind other objects in the three-dimensional space, in particular embodiments the objects may be rendered sequentially based on their respective distance from the viewer. For example, FIG. 6 shows a viewer 601 viewing a three-dimensional space through a display region 602. In the example shown, the three-dimensional space comprises three cubes, each being positioned at a particular distance away from the viewer 601 or the display region 602. In the example shown, cube 610 may be closest to the viewer 601 or the display region 602, cube 612 may be farther relative to cube 610, and cube 611 may be the farthest of the three. In particular embodiments, the object may be rendered in sequence based on their relative distance from the viewer 601 or display region 602. For example, closer objects may be rendered earlier (e.g., the rendering sequence of the three cubes may be cube 610, cube 612, and 611). One advantage of rendering the objects in this manner is that objects that are hidden behind closer objects may not be visible and therefore need not be rendered, which in turn saves processing time.

While the rendering order may be based on the objects' distance from the viewer (e.g., closer objects may be rendered first), doing so may not always yield the desired result. For example, if a scene on Mars includes a red filter, smoke, and an astronaut placed in that order in 3D space from the viewer, rendering the objects in the same order may result in the smoke having a red tint. To retain the original color of the smoke, the smoke may be rendered first, followed by the red filter and astronaut so that the astronaut would have the desired red tint but not the smoke. In particular embodiments, the Editor may define a rendering-order system that allows designers to designate the rendering order for each object relative to one another. For example, the designer may associate each object with a rendering order or "layer," which may represent a rendering order relative to the other objects. The sequence in which objects are rendered may be based on the layers or rendering orders associated with the objects. For example, if the first, second, and third rendering layers are assigned to cube 612, cube 610, and cube 611, respectively, the cubes may be rendered in that same order, even though cube 610 is relatively closer the viewer 601 than cube 612. Thus, the sequence for rendering objects in different layers may be based on their assigned layers or rendering orders, regardless of their relative positions in the three-dimensional space. In particular embodiments, more than one object may be associated with a layer. In particular embodiments, the rendering order for objects in the same layer may be based on their relative distance to the viewer 601 or display region 602. In particular embodiments, each object may be assigned, by default, a layer or rendering order that corresponds to the order in which the object is added to the design relative to other objects. For example, if cube 612 was added to the design first, followed by cube 610 and cube 611 in that order, the cubes may be assigned the default rendering orders of first, second, and third, respectively. In particular embodiments, the user may change the layer assigned to an object. In particular embodiments, the Editor may provide a user interface that displays an ordered list 620 of entries, each of which representing an objected defined in the three-dimensional space. The relative positions of the entries in the ordered list may represent relative rendering orders. For example, the layer list or rendering-order list 620 shown in FIG. 6 shows, from top to bottom, cube 612, cube 610, and 611. The sequence in which these cubes are listed may represent their rendering order (e.g., cube 612 may be rendered first and cube 611 may be rendered last). In particular embodiments, the order of the entries in the list 620 may be altered in the panel using a drag-and-drop or other user-input mechanism. For example, a user wishing to render cube 611 first may drag the last entry in the list 620 and drop it above the first entry, which may result in the new ordered list to be, from to bottom, cube 611, cube 612, and cube 610. In particular embodiments, the list 620 may instead show labels assigned to layers, and a separate list may show objects in the design. In particular embodiments, the listing of each object may have an indicator that indicates the layer associated with the object.

The color that is ultimately assigned to a pixel in a display region may depend in part on the relative distances between the display region and the objects in the three-dimensional space. For example, a red polygon may completely obstruct a green polygon that is farther away from the viewer, and therefore the color red, and not green, may be stored in a color buffer to reflect the current state of what should be displayed. In particular embodiments, in order to account for potentially hidden objects (e.g., the green polygon), the rendering engine may perform a relative depth comparison between objects and ignore those that are hidden. In particular embodiments, in order to perform the depth comparison efficiently, the rendering engine may use a depth buffer or z-buffer to track the depths of the pixels that are present in the color buffer. In other words, the depth buffer may track the depths of the pixels that are currently visible or closest to the viewer. With the depth buffer, the rendering engine would only need to compare the depth of each pixel of a new object to the corresponding depth stored in the depth buffer to determine which is closest.

More specifically, in particular embodiments the process for rendering objects defined in three-dimensional space may include the use of buffers or matrices to track the color that should be presented by each pixel in the display region. In particular embodiments, a depth buffer and a corresponding color buffer may be defined such that each cell in each buffer may represent a pixel in the display region. For example, if a display region has 200×200 pixels, the depth buffer and color buffer may each be defined as a 200×200 matrix, with each cell in the matrix being associated with a pixel. In particular embodiments, each cell in the depth buffer may be used to store the distance between the display region and the then-closest object appearing at the pixel associated with the cell. For example, if a point of an object (e.g., a point on the surface of a sphere) would be displayed by a pixel, the corresponding cell in the depth buffer may store the distance between that point and the pixel on the canvas. In particular embodiments, the distance may be normalized to be a value between 0 and 1, where a smaller value represents closer proximity. In particular embodiments, the corresponding cell in the color buffer may be configured to store the color of the point in the then-closest object that appears at the pixel. For example, if a red sphere is in three-dimensional space and is the then-closest object to the display region (e.g., it may be the first object processed), conceptually a rendering engine may project the red sphere onto the two-dimensional display region to determine which pixels would display the red sphere. In particular embodiments, cells corresponding to those pixels in the display buffer may store the distances between the pixels and the corresponding points of the red sphere, and cells corresponding to the same pixels in the color buffer may store the colors of those point (e.g., red or shades of red). In particular embodiments, since the red sphere may not be the only object in the three-dimensional space, information stored in the depth buffer and color buffer may change. For example, if the red sphere discussed previously is the first object rendered, the depth buffer and color buffer may store distance and color information pertaining to the red sphere. If the next object processed is a green sphere that is positioned behind and partially hidden by the red sphere, the rendering engine may first compute the distances between the visible points on the green sphere and the corresponding pixels in the display region. Then, the distance information of each point may be compared to the corresponding distance information stored in the depth buffer for the associated pixel to determine whether the green sphere at that pixel is visible. If the point on the green sphere is closer than the then-closest point on the red sphere, the depth buffer and color buffer may be updated to reflect the distance and color information of the green sphere, respectively. On the other hand, if the point on the green sphere is farther, then no updates may be performed so that the depth buffer and color buffer continue to store the red sphere's information. Since in this example the green sphere is only partially covered by the red sphere, the end result of this second iteration of processing would be that some cells in the buffers would store the red sphere's information and some cells would store the green sphere's information.

In particular embodiments, the rendering process described above may be adjusted for objects with special properties. For example, if the red sphere in the above example is transparent or translucent, the viewer should be able to see the green sphere through the red polygon. In other words, the color of the green sphere should contribute to the color displayed. The above process, however, may not yield the expected result. As an example, assuming the red sphere is already in the buffers, the rendering engine, when processing the green sphere, may: (1) compute a distance between the display region (or view) and a point on the green sphere; (2) read the depth buffer to determine the distance between the display region and the then-closest object (in this case, the red sphere); (3) compare green sphere's distance to the then-closest distance; (4) determine that the point on the green sphere is hidden behind the red sphere because its distance is farther away; and (5) ignore that point on the green sphere. The end result of this example is that green may not contribute to the color buffer, even though it should because the red sphere in this case is transparent or translucent.

When dealing with objects with special properties, designers traditionally have to manually manipulate how the depth buffer is used in order to render the desired scene. This typically requires advanced knowledge of how depth buffer works and its effects, as well as knowing how to change the rendering process' behavior with respect to the depth buffer and that particular object. To simplify this process, the Editor in particular embodiments may provide a user interface allowing designers to select the desired special property for an object, such as opaque, transparent or translucent, overlay, and cutout. Once selected, the Editor would handle the corresponding depth-buffer manipulation, thereby abstracting away the complications of direct depth-buffer manipulation. Thus, the designer would not need to know how to configure the depth-buffer to effectuate the desired visual effect and would no need to do so manually through coding.

Figure 7A:
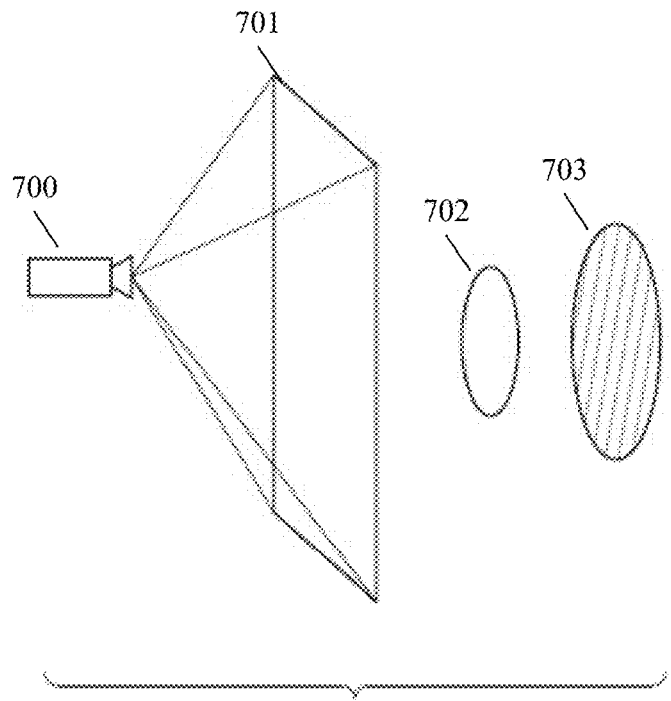
FIGS. 7A-7B illustrate an example of an object having an opaque property.
Figure 7B:
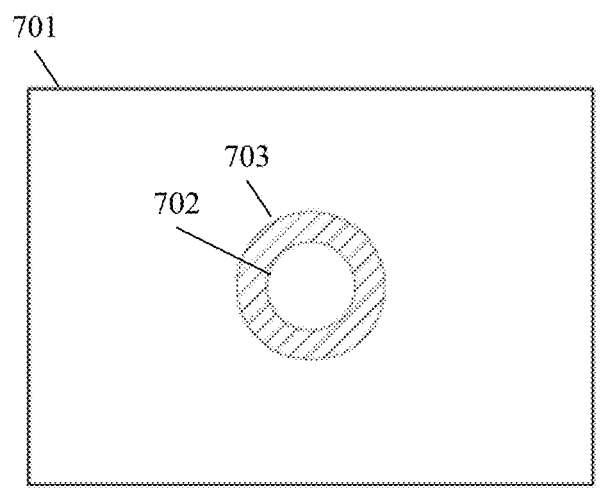

FIGS. 7A-7B illustrate an example of an object having an opaque property. FIG. 7A illustrates a camera 700, which represents the position of a viewer, and a display region 701 through which a scene of a three-dimensional space is displayed. The example shows two opaque objects in the three-dimensional space, a first plane 702 and a second plane 703, positioned such that the first plane 702 is in front of the second plane 703 with respect to the camera 700. FIG. 7B illustrates the scene of the three-dimensional space as displayed on the display region 701. Because the first plane 702 is opaque, it completely covers a portion of the second plane 703.

In particular embodiments, the Editor may provide a user interface through which a designer may indicate that an object has an opaque property. In particular embodiments, the Editor in response may automatically associate the object with instructions (e.g., in OpenGL®) that would enable reading and writing to the depth buffer when the object is being rendered. Thus, for example, when the opaque object is being rendered, its distance information may be compared with the distance information stored in the depth buffer to determine whether the object appears in front of the then-closest object, which in turn indicates whether the object is visible (at least with respect to the other objects that have been processed before it). If the object is the closest, then the distance information associated with the object may be written to the depth buffer so that it may serve as the new reference point for determining whether subsequently processed objects are visible. As such, other objects positioned behind the opaque object, as determined using the depth buffer, may not contribute to the corresponding pixels' colors and would thus appear hidden.

Figure 8A:
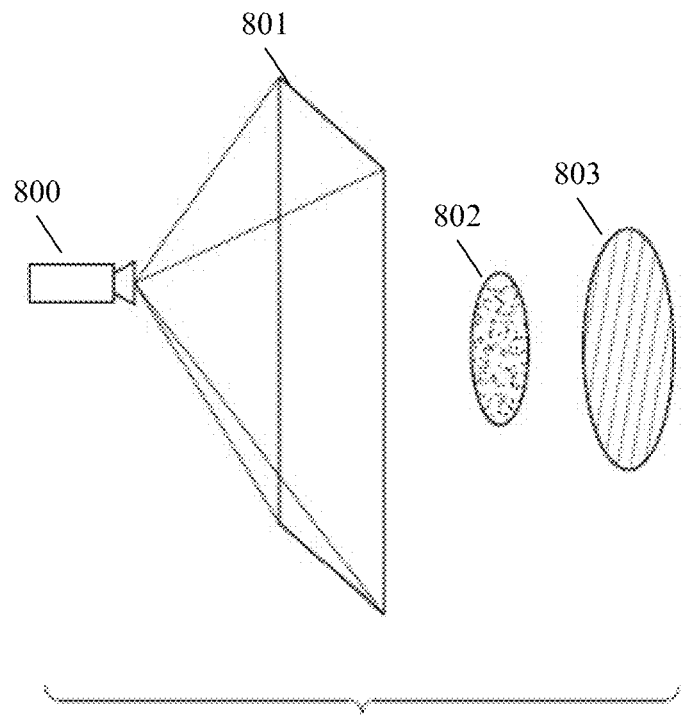
FIGS. 8A-8B illustrate an example of an object having a transparent/translucent property.
Figure 8B:
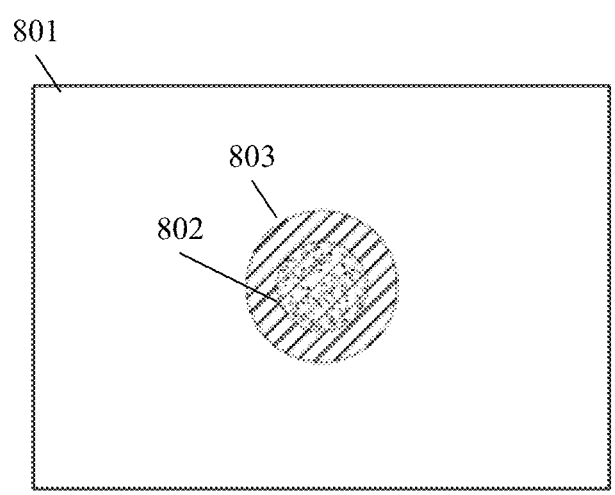

FIGS. 8A-8B illustrate an example of an object having a transparent or translucent property. FIG. 8A illustrates a camera 800, which represents the position of a viewer, and a display region 801 through which a scene of a three-dimensional space is displayed. The three-dimensional space includes a transparent/translucent plane 802 and an opaque plane 803, with the transparent plane 802 positioned in front of the opaque plane 803 with respect to the camera 800. FIG. 8B illustrates the scene of the three-dimensional space as displayed on the display region 801. Because the transparent/translucent plane 802 allows light through, the opaque plane 803 is visible through the transparent/translucent plane 802. In other words, the opaque plane 803 contributes to the pixels occupied by the transparent/translucent plane 802, despite being positioned behind the transparent/translucent plane 802.

In particular embodiments, the Editor may provide a user interface through which a designer may specify that an object has a transparent or translucent property. In particular embodiments, the Editor in response may associate the object with instructions (e.g., in OpenGL®) that would enable reading to the depth buffer and disable writing to the depth buffer when the object is being rendered. Conceptually, regardless of whether the object is transparent/translucent, another object (e.g., an opaque object) that appears in front of it may obstruct it from view. Thus, for example, when a transparent/translucent object is being rendered, its distance information may be compared with the distance information stored in the depth buffer to determine whether the object appears in front of the then-closest object, which in turn indicates whether the object is visible (at least with respect to the other objects that have been processed before it). However, since the object is transparent or translucent, other objects that appear behind it may still contribute to the corresponding pixels' colors so that those other objects may be visible through the transparent or translucent object. In particular embodiments, this may be effectuated by disabling writing to the depth buffer even if the transparent/translucent object is the then-closest object, so that the transparent/translucent object's position or distance information does not prevent other objects behind it from being rendered.

Figure 9A:
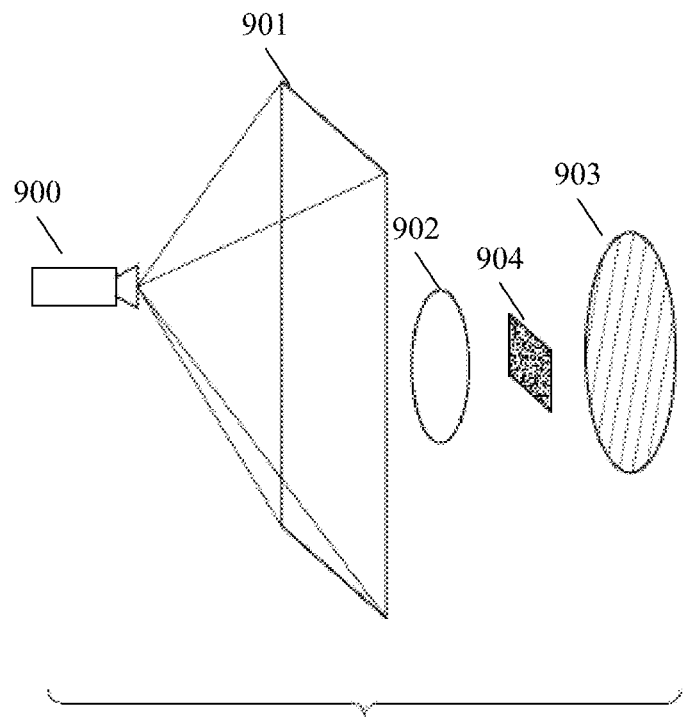
FIGS. 9A-9B illustrate an example of an object having an overlay property.
Figure 9B:
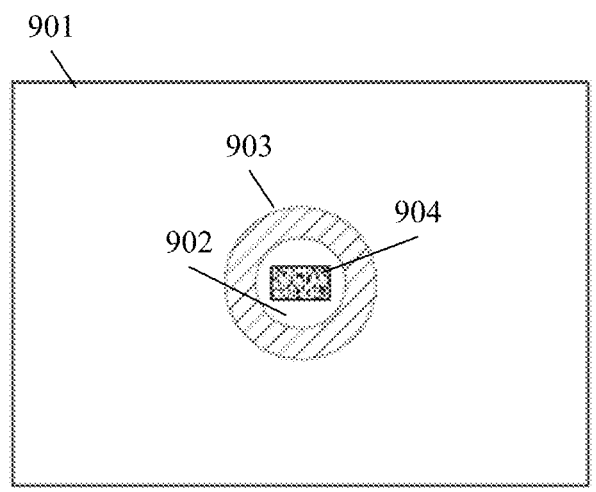

FIGS. 9A-9B illustrate an example of an object having an overlay property. FIG. 9A illustrates a camera 900, which represents the position of a viewer, and a display region 901 through which a scene of a three-dimensional space is displayed. The three-dimensional space includes a first opaque plane 902 and a second opaque plane 903, with the first opaque plane 902 positioned in front of the second opaque plane 903 with respect to the camera 900. FIG. 9A also shows an overlay 904, which in this example is positioned in between the first opaque plane 902 and second opaque plane 903. An overlay may be, for example, a banner, a logo, informational text, on-screen menu, and any other visual object that is designed to be visible to a viewer regardless positions of other objects in the scene. FIG. 9B illustrates the scene of the three-dimensional space as displayed on the display region 901. The overlay object 904 is visible despite being positioned behind the first opaque plane 902.

In particular embodiments, the Editor may provide a user interface through which a designer may specify that an object has an overlay property. In particular embodiments, the Editor in response may associate the object with instructions (e.g., in OpenGL®) that would disable reading to the depth buffer and enable writing to the depth buffer when the object is being rendered. Conceptually, an overlay may be designed to be visible and appear in front of other objects regardless of its position relative to those objects. Thus, in particular embodiments, when an overlay object is being rendered, it may not be necessary to compare its distance information to the distance information of other objects stored in the depth buffer. In particular embodiments, this may be implemented by disabling depth-buffer reading for this object. Since the overlay would obstruct objects positioned behind it, in particular embodiments distance information associated with the overlay may be written to the depth buffer so that hidden objects need not be rendered. In particular embodiments, the distance information associated with an overlay object may be 0 to indicate that it is at the front-most position, regardless of the actual distance between the overlay object and the display region or viewer in three-dimensional space.

Figure 10A:
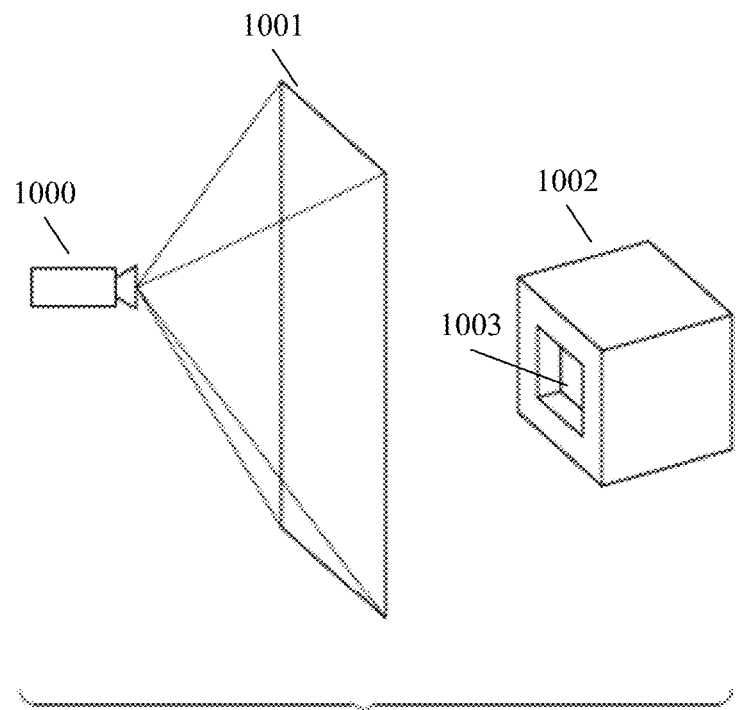
FIGS. 10A-10B illustrate an example of an object having a cutout property.
Figure 10B:
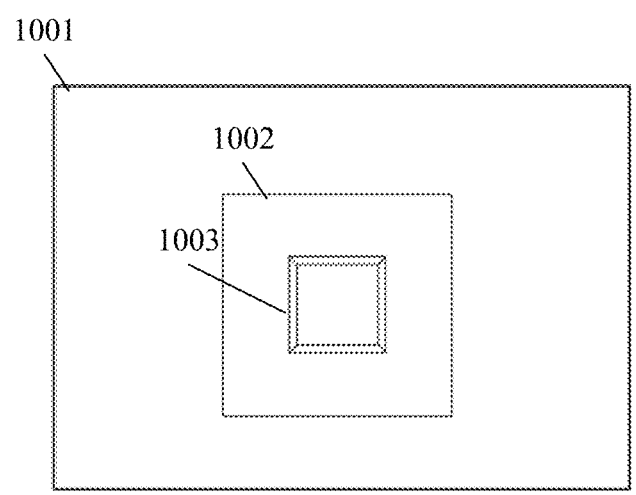

FIGS. 10A-10B illustrate an example of an object having a cutout property. FIG. 10A illustrates a camera 1000, which represents the position of a viewer, and a display region 1001 through which a scene of a three-dimensional space is displayed. The three-dimensional space includes a cube 1002 and cutout 1003 of the cube. A cutout defines a portion of another object that is to be removed. In the example shown, the cutout 1003 is defined as a smaller cube within the cube 1002. The end visual effect is a cube 1002 with a cubic hole on one side. FIG. 10B illustrates the scene of the three-dimensional space as displayed on the display region 1001. It is shown here that the surface of the cube 1002 facing the camera 1000 has a cubic hole in the middle, as defined by the cutout 1003.

In particular embodiments, the Editor provides a user interface through which a designer may specify that an object has a cutout property. In particular embodiments, the Editor in response may associate the object with instructions (e.g., in OpenGL®) that would disable reading and writing to the depth buffer when the object is being rendered. Conceptually, a cutout object may not be visible itself, since it may be used to define a portion of another object that is to be removed. Thus, in particular embodiments, a cutout object should be rendered regardless of whether it is hidden. In particular embodiments, this may be effectuated by disabling depth-buffer reading for the cutout object. Because the cutout object may not be visible itself, it may not affect the rendering of other objects that appear behind it. In other words, when other objects are being rendered, they may discount the cutout object even if they appear behind it. In particular embodiments, this may be effectuated by disabling writing to the depth buffer, so that the cutout object's position or distance information does not prevent other objects behind it from being rendered.

Figure 11:
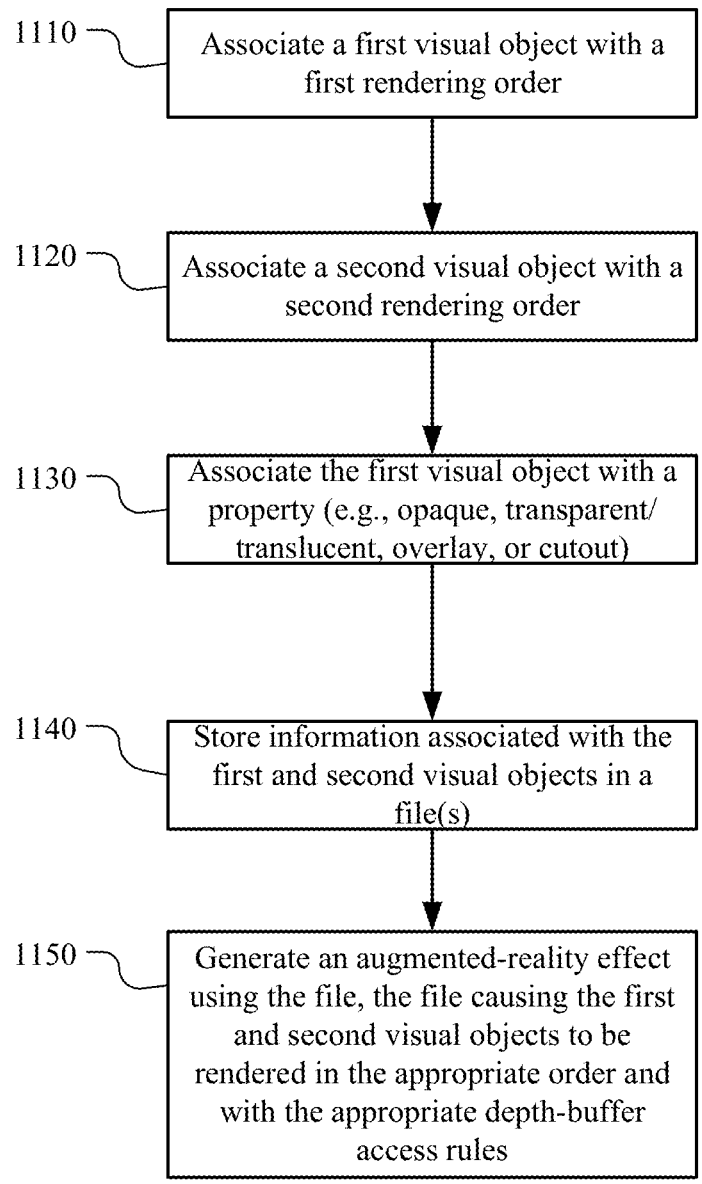
FIG. 11 illustrates an example method for controlling how objects are rendered using an augmented-reality design editor.

FIG. 11 illustrates an example method 1100 for controlling how objects are rendered using an augmented-reality design editor. At step 1110, the editor may associate a first visual object with a first rendering order specified by a user. At step 1120, the editor may associate a second visual object with a second rendering order specified by the user. The first and second visual objects may be defined in a three-dimensional space. In particular embodiments, the rendering order of each visual object may be changed. In particular embodiments, an ordered list of entries may be displayed in the editor, each entry representing a visual object defined in the three-dimensional space. In particular embodiments, the relative positions of the entries in the ordered list may represent relative rendering orders. In particular embodiments, the relative rendering orders may be changed by adjusting the relative orders of the entries in the list. At step 1130, the editor may associate the first visual object and/or second visual object with an opaque property, transparent/translucent property, overlay property, or cutout property. In particular embodiments, the editor may display a user interface associated with the first virtual object (e.g., as a menu) and provide one or more selectable properties, such as opaque, transparent/translucent, overlay, and cutout. At step 1140, the editor may store the information associated with the first and second visual objects in one or more files, including, e.g., information associated with the first visual object, the first rendering order, the second visual object, the second rendering, and/or the property (e.g., transparent). In particular embodiments, depth-buffer access instructions corresponding to the specified property may also be stored. For example, for opaque objects, depth-buffer read and write access may be enabled; for transparent/translucent objects, depth-buffer read may be enabled and write may be disabled; for overlay objects, depth-buffer read may be disabled and write may be enabled; for cutout objects, depth-buffer read and write may be disabled. At step 1150, the file(s) may be used to render an augmented-reality effect to generate a scene in the three-dimensional space. In particular embodiments, the first visual object and the second visual object may be rendered sequentially in an order determined based on the first rendering order and the second rendering order. For example, the first visual object may be associated with rendering order 1 and the second visual object may be associated with rendering order 2, which may cause the first visual object to be rendered before the second visual object. As another example, if the first and second visual objects are associated with rendering orders 2 and 1, respectively, the second visual object may be rendered before the first visual object. In particular embodiments, the rendering order may be independent of the relative positions of the objects. For example, even if the first virtual object may be positioned in the three-dimensional space closer to a display plane of the scene relative to the second visual object, the first visual object may be configured to be rendered prior to or after the rendering of the second visual object based on a relative order between the first rendering order and the second rendering order. In particular embodiments, more than one visual object may be associated with a rendering order (or layer). In particular embodiments, objects with the same rendering order may be rendered sequentially based on relative positions between the objects in the three-dimensional space.

Particular embodiments may repeat one or more steps of the method of FIG. 11, where appropriate. Although this disclosure describes and illustrates particular steps of the method of FIG. 11 as occurring in a particular order, this disclosure contemplates any suitable steps of the method of FIG. 11 occurring in any suitable order. Moreover, although this disclosure describes and illustrates an example method for controlling how objects are rendered using an augmented-reality design editor, including the particular steps of the method of FIG. 11, this disclosure contemplates any suitable method for controlling how objects are rendered using an augmented-reality design editor, including any suitable steps, which may include all, some, or none of the steps of the method of FIG. 11, where appropriate. Furthermore, although this disclosure describes and illustrates particular components, devices, or systems carrying out particular steps of the method of FIG. 11, this disclosure contemplates any suitable combination of any suitable components, devices, or systems carrying out any suitable steps of the method of FIG. 11.

Figure 14:
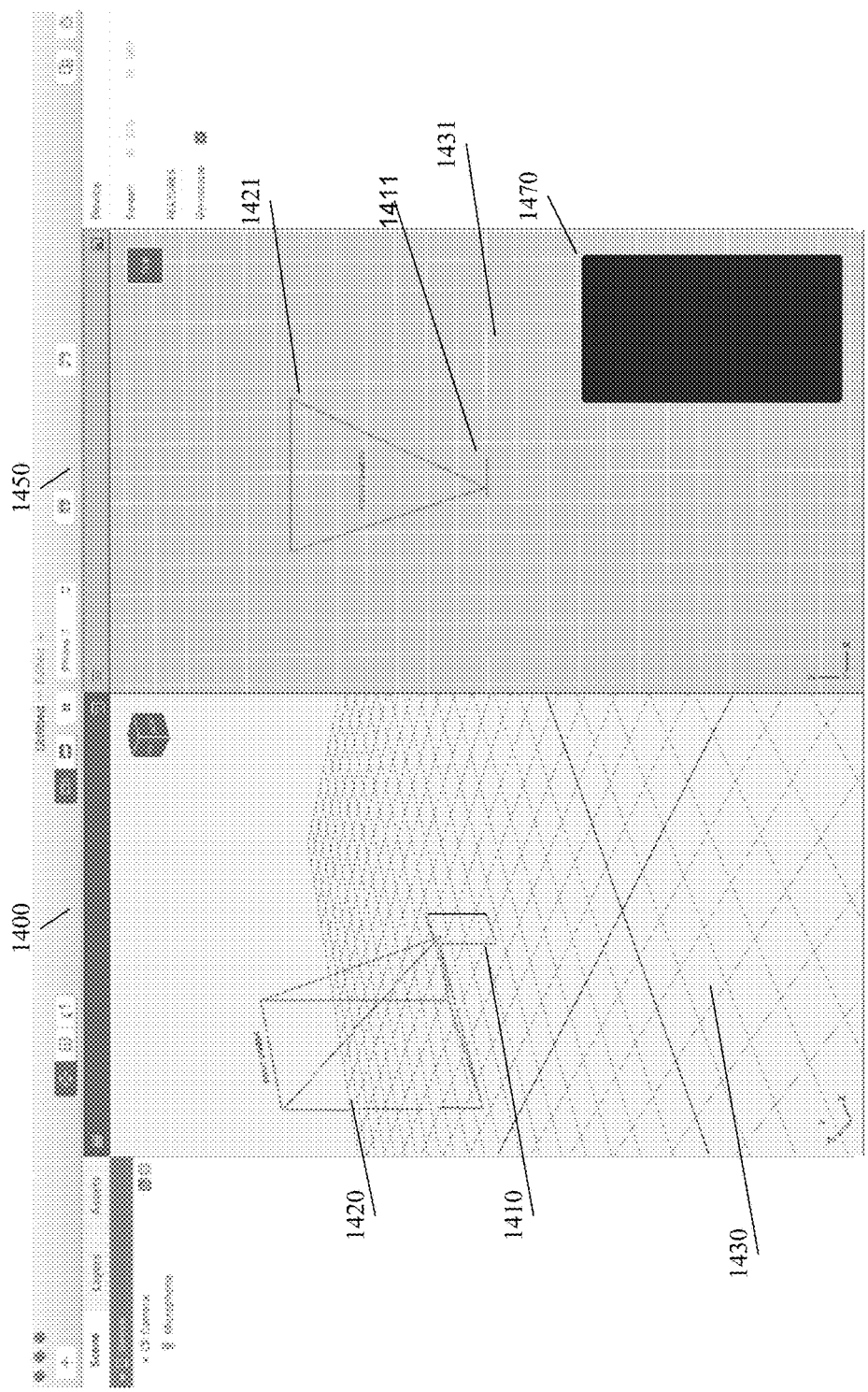
FIG. 14 illustrates an embodiment of an editor providing simultaneous views of an augmented reality effect from different perspectives, with the front camera of a virtual mobile device enabled.

FIG. 14 illustrates an embodiment of the Editor providing simultaneous views of an AR effect from different perspectives. In particular embodiments, an AR effect and the 3D space in which the AR effect is defined may be shown in the Editor from different perspective/views simultaneously. Each perspective may be selectively shown in a separate simulator window. As an example, FIG. 14 illustrates a perspective view 1400 of the 3D space being displayed simultaneously with a top view 1450 of the same space. Aside from these views of the 3D space, a separate simulator window 1470 may be used to display the scene as it would appear on a user's device based on the device's orientation within the 3D space. In particular embodiments, since device-view window 1470 is configured to show what an end user would see, none of the visual design aids (e.g., wireframes of the mobile device and display plane, background grid, and others described below) would be visible through the window. In particular embodiments, the perspective/view presented in each window may be rendered based on the same AR model definition in a 3D space. For example, a virtual object may be defined in 3D space by a model. Depending on the perspective/view that is desired, the rendering engine may render a scene of the virtual object in the 3D space from the corresponding perspective/view. Thus, as the definitions of the model change, so would its appearance in each of the simulator windows. Examples of different views relative to the 3D space include: top, bottom, left, right, front, back, and perspective. For example, if the 3D space is conceptually defined as a cube, the top view would present the scene from the vantage point of a person viewing downwards at the top of the cube, which would appear as a square. While FIG. 14 illustrates the Editor simultaneously presenting a perspective-view simulator window 1400, a top-view simulator window 1450, and a device-view simulator window 1470, the Editor may display any number and any combination of simulator windows configured to simultaneously display different views of the 3D space (e.g., one, two, four, six, etc. windows).

The Editor may provide various visual aids for orienting the designer in each simulator window. In particular embodiments, a simulator window may include a wireframe representation (or any other visual representation) of the configuration of a virtual mobile device and its display plane (or focal plane) within the 3D space. For example, the mobile device may be represented as a polygon and its display plane may be represented as a pyramid stemming from the mobile device polygon. The apex of the pyramid may adjoin the polygon to represent the position of the device's camera. The base of the pyramid may represent the display plane and the sides of the pyramid may represent the field of view of the camera. The scene displayed through the device-view simulator window 1470 may reflect what is visible through the display/focal plane of the device. For example, in FIG. 14, a virtual mobile device may be represented by polygon wireframe 1410 in the perspective-view simulator window 1400 and by wireframe 1411 in the top-view simulator window 1450 (from the top view, the polygon representing the mobile device may appear as a line segment). In addition, FIG. 14 shows the mobile device's display/focal plane using pyramid wireframe 1420 in the perspective-view simulator window 1400 and wireframe 1421 (from the top view, the pyramid representation appears as a triangle) in the top-view simulator window 1450.

Figure 15:
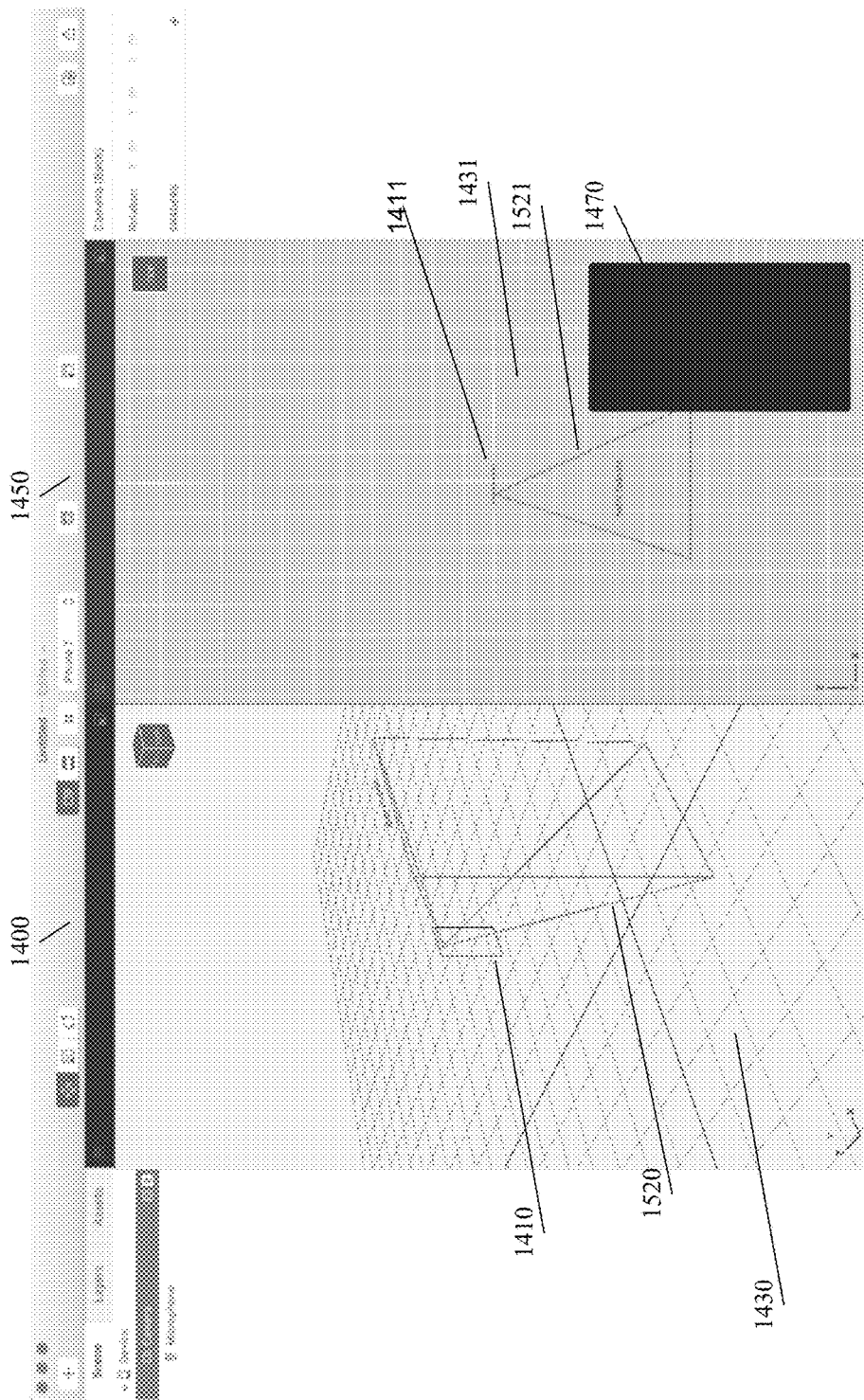
FIG. 15 illustrates an embodiment of an editor providing simultaneous views of an augmented reality effect from different perspectives, with the back camera of a virtual mobile device enabled.

Since mobile devices today typically have a front and a back camera (and sometimes multiple cameras with different fields of view facing the same direction), the Editor in particular embodiments may provide an option to turn on selected camera(s). When a camera(s) is selectively enabled, the pyramid described above may represent the configuration and field of view of the enabled camera(s). For example, FIG. 14 shows a scenario where the front camera is enabled and FIG. 15 shows a different scenario where the back camera is enabled. In FIG. 14, the wireframes 1420 and 1421 are shown to be directed towards one direction, and in FIG. 15 the wireframes 1520 and 1521 are shown to be directed towards the opposite direction. In particular embodiments, the wireframe of the display plane may be labeled to indicate whether it represents the front or back camera's display plane.

To help orient the designer, the Editor in particular embodiments may display a grid in the background of a simulator window to represent the 3D space in which the AR effect is defined. For example, the Editor shown in FIG. 14 uses a grid plane to help orient the designer. The location and orientation of the grid may be fixed in the 3D space. In the perspective-view simulator window 1400, the background grid 1430 may be rendered with depth perception and oriented at an angle corresponding to the orientation of the perspective view. In the top-view simulator window 1450, the background grid 1431 may be shown as a uniform 2D grid. In particular embodiments, the background grid for any of the side views (e.g., top, bottom, left, right, front, and back) may be shown as a uniform 2D grid.

To further help orient the designer, the Editor in particular embodiments may display a view of a cubic icon with labeled sides (e.g., top, front, left, etc.) to represent the current view shown in a simulator window. The cubic icon may conceptually represent the 3D space. For example, depending on the perspective, a corresponding perspective of the cubic icon may be displayed. For example, when a simulator window is displaying the perspective view of the 3D space, a perspective view of the cubic icon may be shown. Similarly, when a simulator window is displaying the top view of the 3D space, a top view of the cubic icon (which would be a 2D square) may be shown. In particular embodiments, the Editor may display a small Cartesian axis to help orient the user in each simulator window. The Cartesian axis may be aligned with the 3D space such that, e.g., the front side of the 3D space is defined to be the X-Y plane and the depth of the 3D space extends in the Z-direction. Thus, for example, if a simulator window is presenting a perspective view, a 3D Cartesian axis (with all three axes visible) would be shown in the perspective view as well. On the other hand, if a simulator window is presenting a top view, a 2D Cartesian axis representing the X-Z plane would be shown.

In particular embodiments, changes to any one of the simulator windows may cause the changes to be simultaneously reflected in the other simulator windows. For example, if an object is added to the scene or 3D space through one simulator window (e.g., the perspective-view window 1400), the other simulator windows (e.g., the top-view window 1450) would simultaneously display the object from their respective perspectives. As another example, if the designer rotates the virtual mobile device 1411 via the top-view window 1450, the virtual mobile device 1410 in the perspective-view window 1400 would also rotate. This allows a designer to edit an AR design from any angle through any simulator window and visualize the resulting 3D model from other angles presented in other simulator windows.

Figure 16:
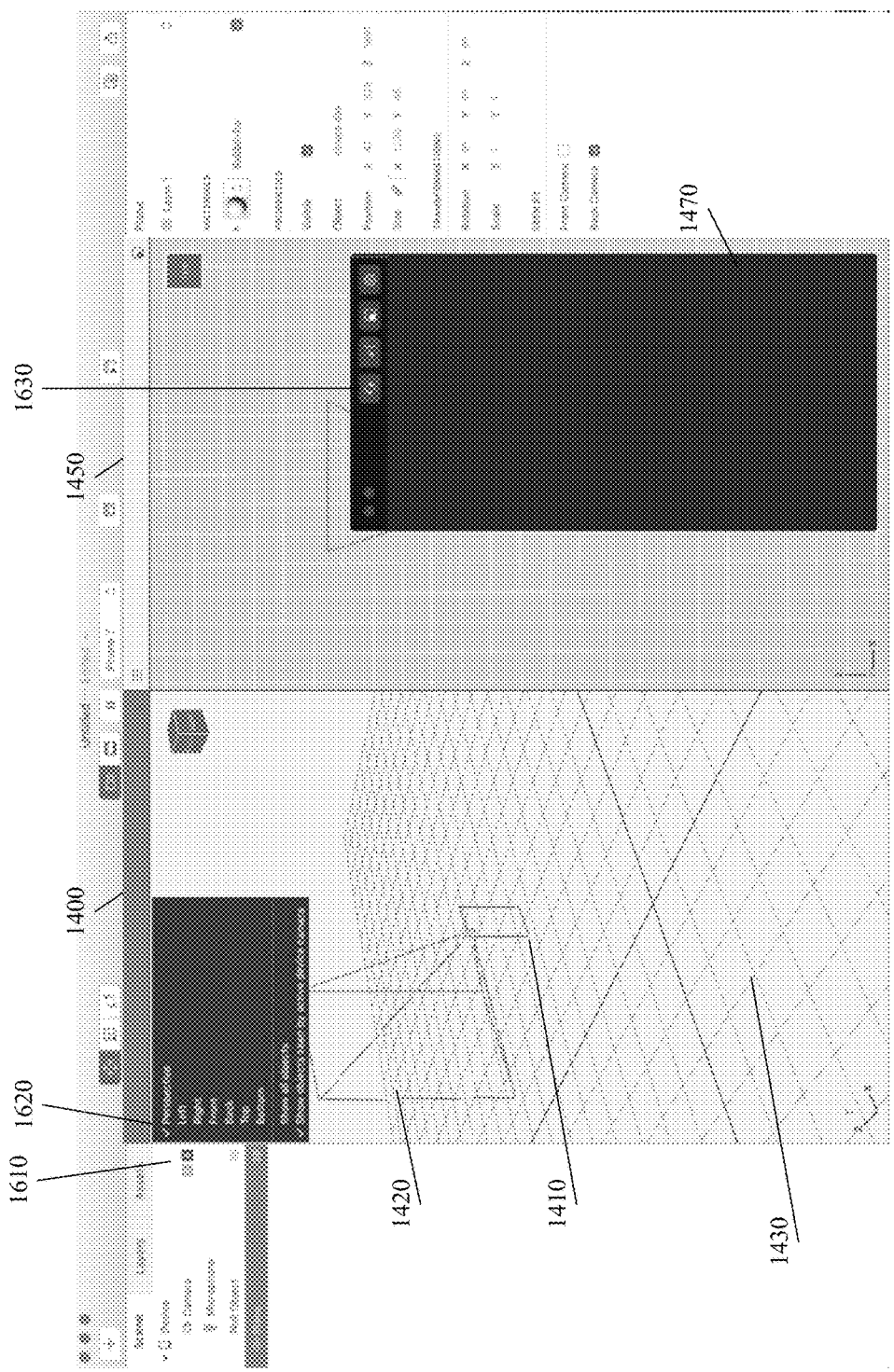
FIG. 16 illustrates examples of various configuration options of an editor.

FIG. 16 illustrates various configuration options of the Editor. For example, if a mobile device is being represented in the 3D design space, the designer may be provided with a toggle user interface to selectively activate and deactivate the cameras of the mobile device. For instance, FIG. 16 shows toggle 1610, which allows the user to specify which camera of the associated mobile device is to be activated (e.g., activating the front camera, the back camera, both the front and back cameras, or none of the cameras). In particular embodiments, objects that are children of the camera node will move, scale, and rotate with the camera. In particular embodiments, a simulator window capable of displaying the 3D space from different views may be independently configurable to display a desired view. For example, a menu 1620 associated with each window (e.g., 1400) may be activated to display different viewing options (e.g., perspective, left, right, etc.). Selection of one of the options (e.g., perspective) may cause the window to switch its display view corresponding to the selected viewing preference. In particular embodiments, the device-view simulator window 1470 may include a toggle option 1630 allowing a designer to selectively activate different cameras of the simulated device (e.g., front or back camera). The scene displayed in the device-view simulator window 1470 would then reflect the scene captured by the activated camera.

In particular embodiments, the device-view simulator (e.g., 1470 in FIG. 14) may provide various control options for the designer to simulate user interactions with the simulated mobile device. For example, the device-view simulator may be configured to handle a drag-and-drop input from the designer's mouse and translate it into a simulated rotation/movement of the simulated mobile device. In other words, a designer may use an input device (e.g., mouse, track pen, touch screen, etc.) to rotate the virtual mobile device. In particular embodiments, the Editor may communicate with a real mobile device and receive gyroscope data from the real mobile device to adjust the orientation and focal plane of the virtual mobile device accordingly. In particular embodiments, the rendered AR effect scene may be shown on the real mobile device. In particular embodiments, a touch event corresponding to a user touching the mobile device's display may be simulated using a mouse click (e.g., clicking while holding the CTRL key or COMMAND key).

In particular embodiments, the Editor may provide photos or videos to simulate a "real world" scene captured by the camera to test the AR effects. In particular embodiments, an AR effect may be tested using a photo/video sphere that simulates a real environment (e.g., the inside of a room, the outdoors, etc.) as perceived by a person. In particular embodiments, the photo/video sphere may be overlaid with a pre-recorded video of a person to simulate a user of the AR effect in the simulated environment. In particular embodiments, the sphere may be a 360° sample environment (a stock video) captured using a 360° camera, and the video of a person may be a pre-recorded video of a person performing various motions in front of a green-screen. In particular embodiments, the virtual mobile device may be defined to be positioned at the center of the sphere and, depending on the device's orientation, the appropriate scene from the photo/video sphere may be used as the background. In particular embodiments, the video of the person may be shown in the display plane regardless of the camera's orientation (e.g., similar to a person moving his device around while taking a selfie).

In particular embodiments, each virtual AR object in an AR effect may be individually configured to be associated with either the display plane of the camera (e.g., labeled 1420 and 1421 in FIG. 14) or the 3D space in which the AR object is defined. An AR effect may include AR objects associated with the display plane and/or objects associated with the 3D space. AR object associated with the display plane may move with the display plane as the display plane changes orientation. Such an AR object may always be in view, and may be suitable for, e.g., a virtual "sticker" on the screen, a banner, control panel user interface, etc. Alternatively, an AR object may be defined in 3D space at a particular location and may remain at that location regardless of the orientation of the display plane. Such an AR object may be visible on the display plane if it is within the camera's field of view, and may be suitable for, e.g., a virtual object in the environment (e.g., a tree, a building, a dog, etc.).

Figure 17:
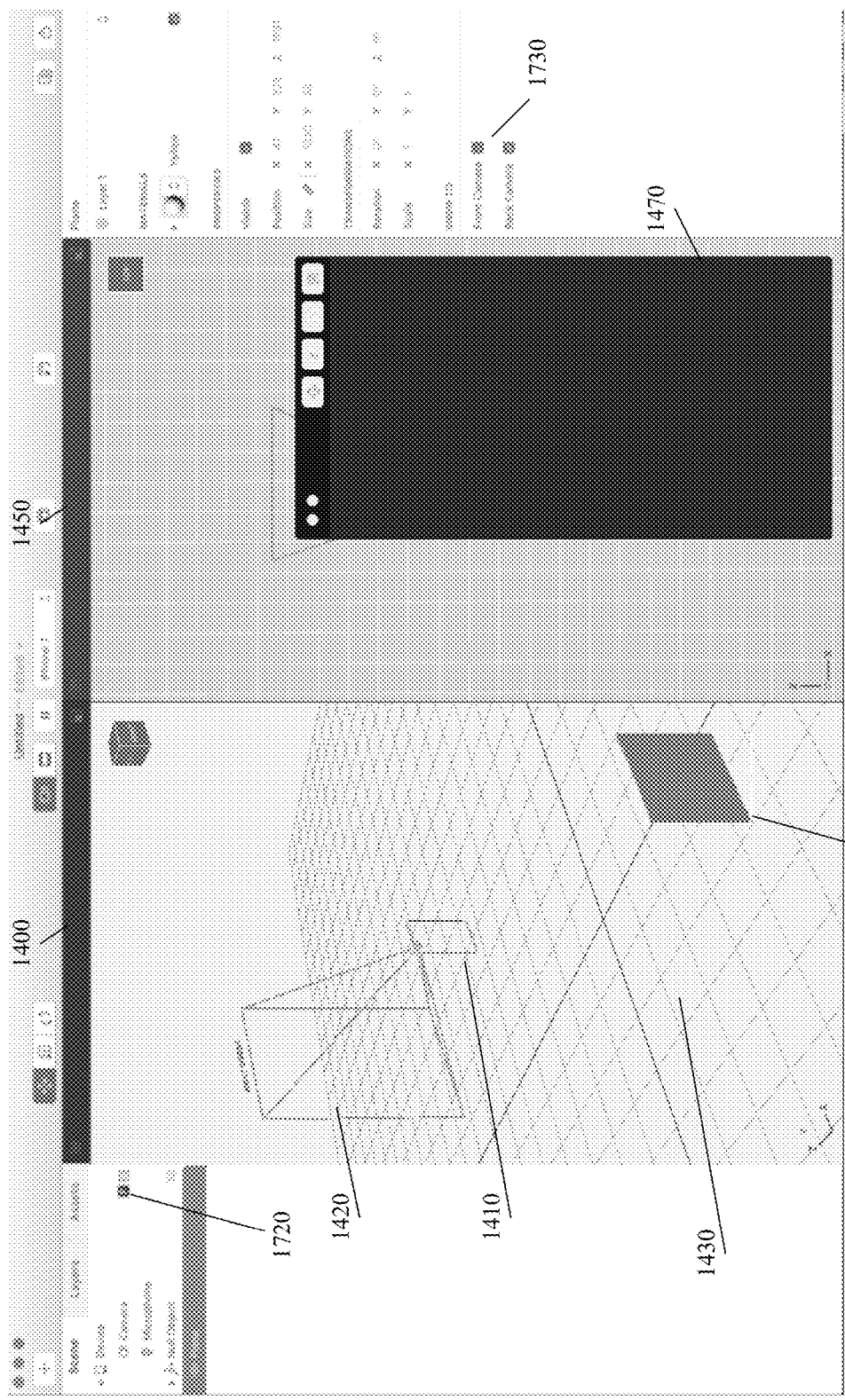
FIG. 17 illustrates an example scenario where an AR object is associated with both the front camera and back camera.

In particular embodiments, each virtual AR object in an AR effect may be individually configured to be associated with any camera(s) (e.g., front, back, and/or any other available cameras) of the simulated mobile device so that the object is visible when the associated camera(s) is activated/enabled. Thus, an AR effect may include both objects that are only visible to the front camera, objects that are only visible to the back camera, objects that are only visible to any other camera, and objects that are visible to any combination of the available cameras. FIG. 17 illustrates an example scenario where an AR object is associated with both the front camera and back camera. As shown, the AR object 1710 is individually configured to be associated with both the front and back cameras, as indicated by the configuration parameter 1730. The virtual mobile device in this case has its front camera enabled, as shown by the configurable toggle switches 1720. Since the AR object 1710 is to be shown to the front (and back) camera, the AR object 1710 is visible in the simulator window 1400 and would have also been visible in the other simulator window if not for the relevant portions being covered by the device-view simulator window 1470. In this example, the AR object 1710 is not shown in the device-view simulator window 1470 because the field of view 1420 of the virtual mobile device 1410 does not cover the region where the AR object 1710 is positioned (the camera is pointing away from it).

Figure 18:
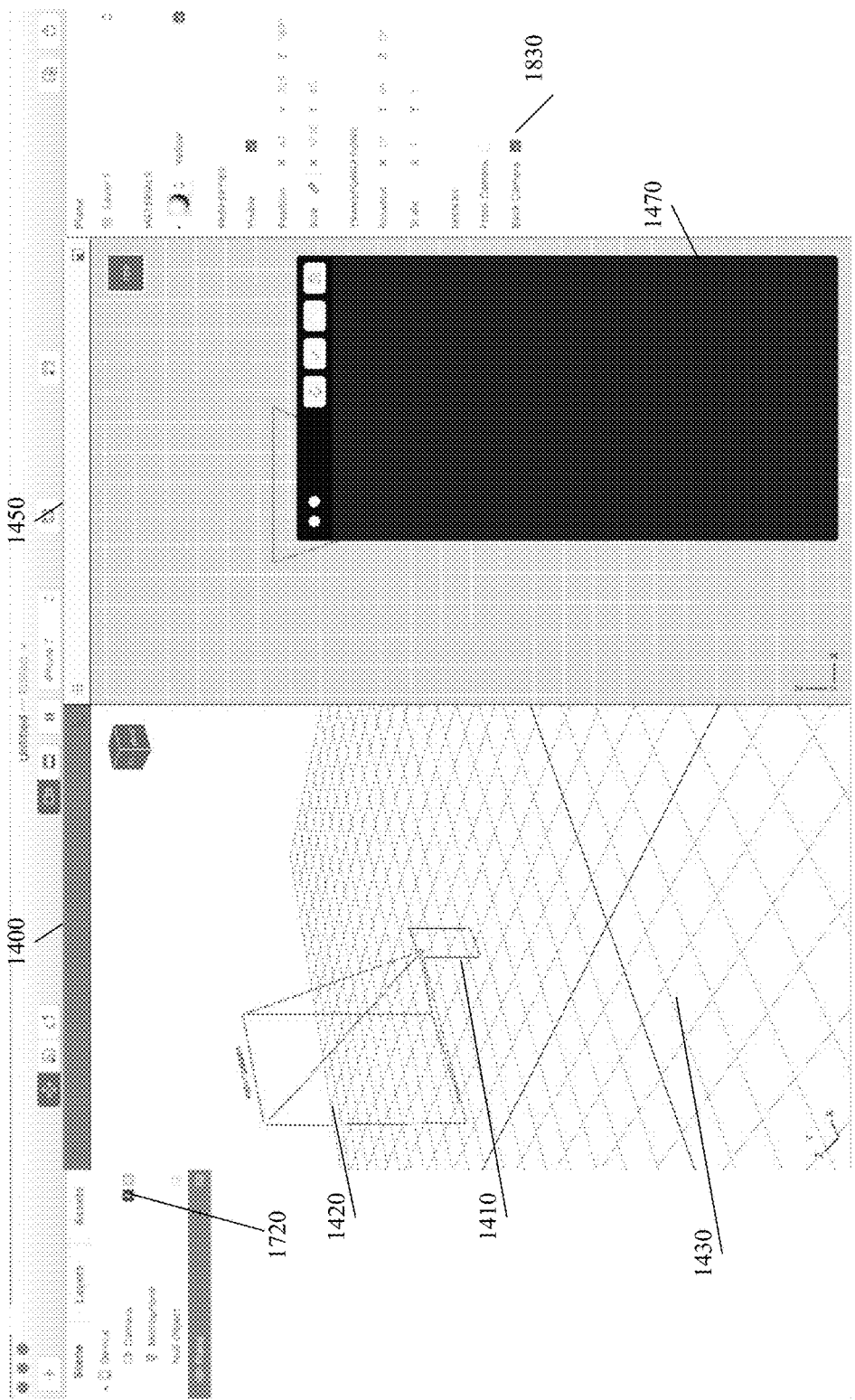
FIG. 18 illustrates an example scenario where an AR object is associated with the back camera and not the front camera and when only the front camera is active.

FIG. 18 illustrates an example scenario where an AR object is associated with the back camera and not the front camera when only the front camera is active. In this example, the AR object (not shown) is individually configured to be associated with only the back camera, as indicated by the configuration parameter 1830. The virtual mobile device in this case only has its front camera enabled, as shown by the configurable toggle switches 1720. Since the AR object is to be shown only to the back camera, the AR object is not presented in any of the simulator windows 1400 1450 and 1470 when the back camera is disabled.

Figure 19:
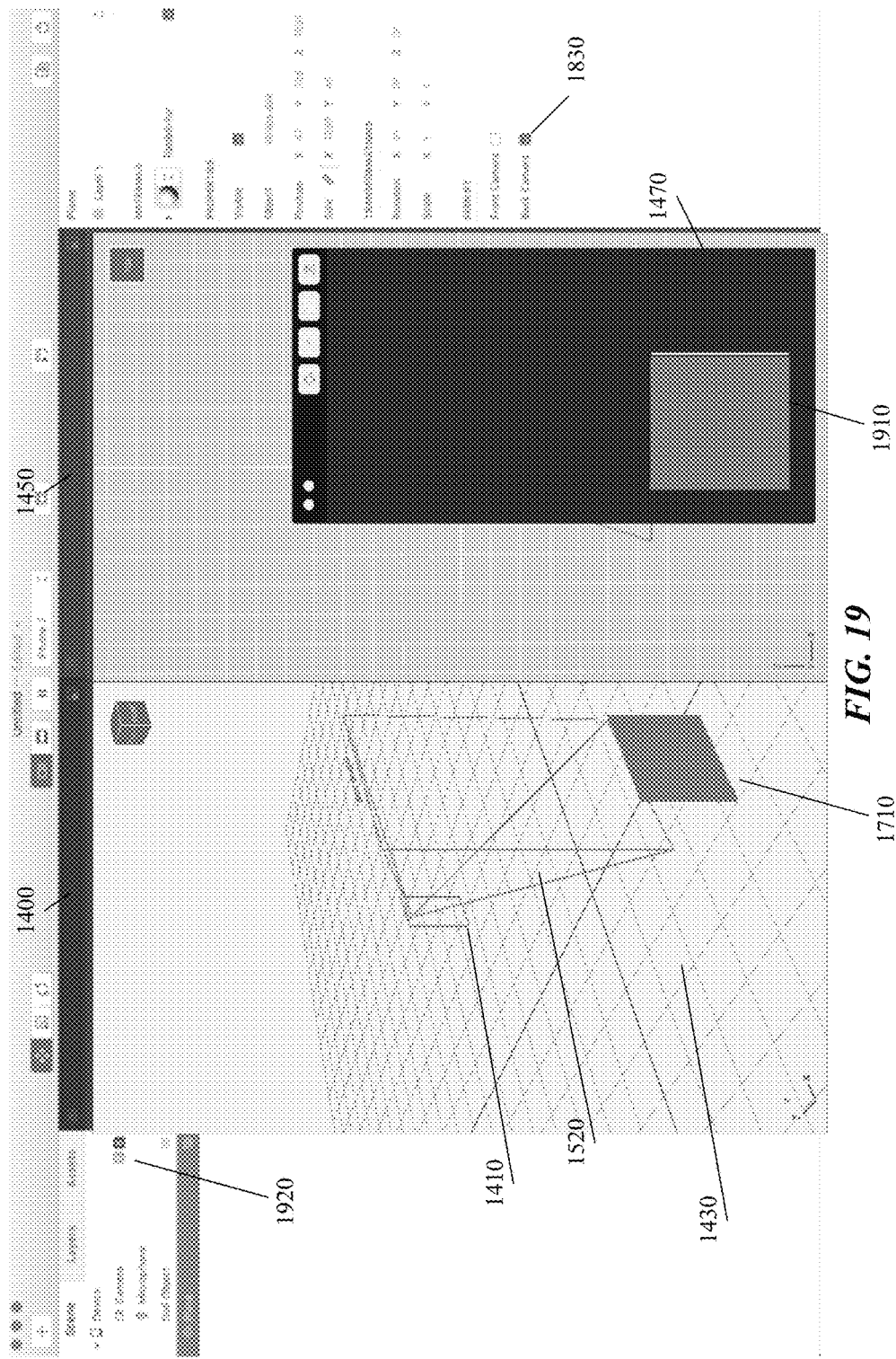
FIG. 19 illustrates an example scenario where an AR object is associated with the back camera and not the front camera and when only the back camera is active.

FIG. 19 illustrates an example scenario where an AR object is associated with the back camera and not the front camera when only the back camera is active. As shown, the AR object 1710 1910 is individually configured to be associated with only the back camera, as indicated by the configuration parameter 1830. The virtual mobile device in this case has its back camera enabled, as shown by the configurable toggle switches 1920. Since the AR object 1710 1910 is to be shown to the back camera, the AR object 1710 is visible in the simulator window 1400 and it would have also been visible in the other simulator window 1450 if not for the relevant portions being covered by the device-view simulator window 1470. In this example, the AR object 1910 is shown in the device-view simulator window 1470 because the field of view 1520 of the virtual mobile device 1410 covers the region where the AR object is positioned in 3D space (the camera is pointing towards it), as shown in the perspective-view window 1400.

Figure 20:
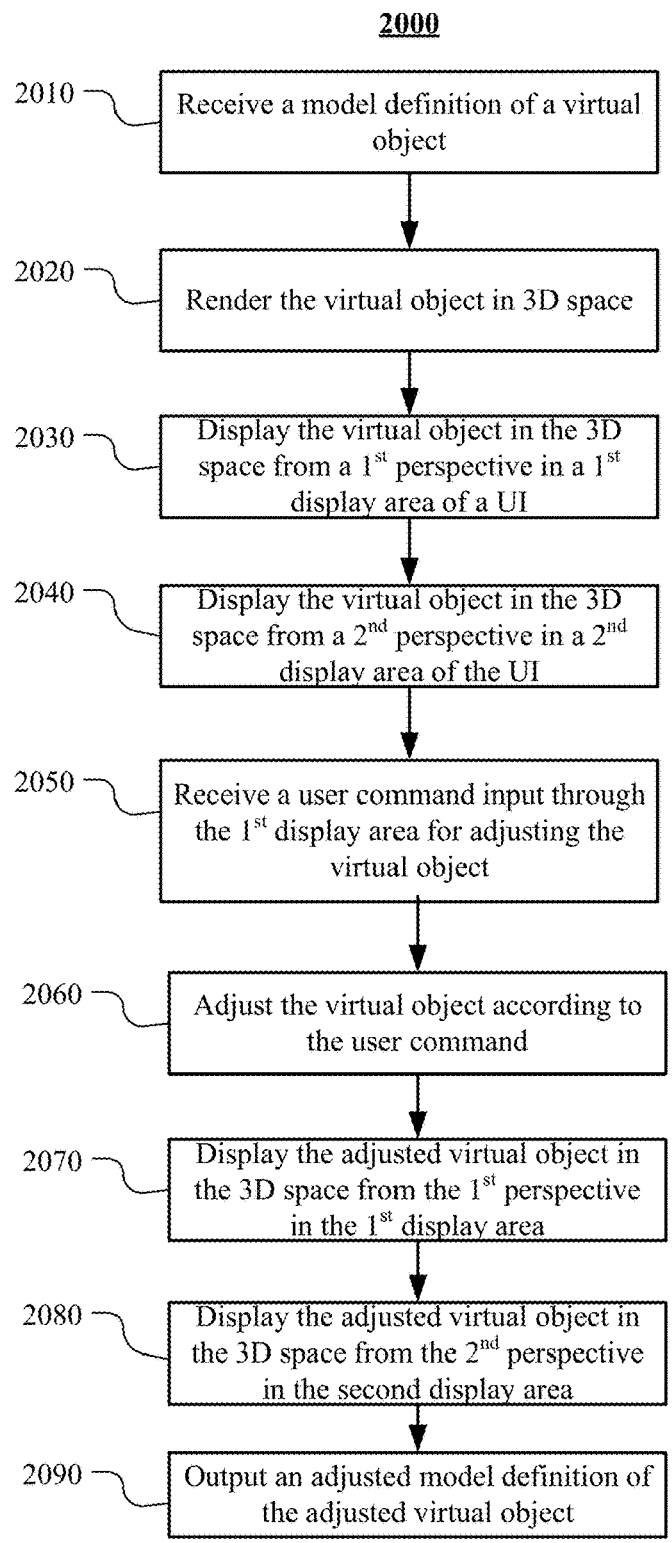
FIG. 20 illustrates an example method for simultaneously presenting multiple perspectives or views of an AR design using an augmented-reality design editor.

FIG. 20 illustrates an example method 2000 for simultaneously presenting multiple perspectives or views of an AR design using an augmented-reality design editor. At step 2010, the editor may receive a model definition of a virtual object. In particular embodiments, the model definition may define the location of the virtual object in a 3D space, the relative position of the object with respect to other objects in the 3D space, the camera or user, and/or other real world objects that would be captured by the camera in operation (e.g., a user's face). In particular embodiments, the model definition may indicate whether the virtual object is associated with the display/focal plane of the camera or the 3D space. In particular embodiments, the model definition may indicate to which camera the virtual object is to be shown. In particular embodiments, the model definition may also define how the object would behave in response to particular inputs (e.g., user input, real world objected detected by the camera, etc.). The model definition may comprise definitions for one or more virtual objects.

At step 2020, the editor may render the virtual object in a 3D space based on the model definition. At step 2030, the editor may display the virtual object in the 3D space from a first perspective/view (e.g., from the top, bottom, etc.) in a first display area of a user interface. At step 2040, the editor may display the virtual object in the 3D space from a second perspective/view (e.g., from the left, right, etc.) in a second display area of the user interface. In particular embodiments, the second perspective may be different from the first perspective. At step 2050, the editor may receive a user command for adjusting the virtual object (e.g., a command to change one or more display properties of the object, such as moving, rotating, stretching, sizing, coloring, texturing, skewing, etc.). For example, the user command may be input by a user through the first display area. At step 2060, the editor may adjust the virtual object according to the user command. At step 2070, the editor may display the adjusted virtual object in the 3D space from the first perspective in the first display area. At step 2080, the editor may simultaneously display the adjusted virtual object in the 3D space from the second perspective in the second display area. At step 2090, the editor may output an adjusted model definition of the adjusted virtual object. In particular embodiments, the adjusted model definition may be exported and subsequently loaded into the editor for further modifications. In particular embodiments, the exported adjusted model definition may be consumed by an AR rendering engine on a user's model device and, in operation, display the adjusted augmented reality effect with the real world scene that is captured by that model device.

Particular embodiments may repeat one or more steps of the method of FIG. 20, where appropriate. Although this disclosure describes and illustrates particular steps of the method of FIG. 20 as occurring in a particular order, this disclosure contemplates any suitable steps of the method of FIG. 20 occurring in any suitable order. Moreover, although this disclosure describes and illustrates an example method for simultaneously presenting multiple perspectives or views of an AR design using an augmented-reality design editor, including the particular steps of the method of FIG. 20, this disclosure contemplates any suitable method for simultaneously presenting multiple perspectives or views of an AR design using an augmented-reality design editor, including any suitable steps, which may include all, some, or none of the steps of the method of FIG. 20, where appropriate. Furthermore, although this disclosure describes and illustrates particular components, devices, or systems carrying out particular steps of the method of FIG. 20, this disclosure contemplates any suitable combination of any suitable components, devices, or systems carrying out any suitable steps of the method of FIG. 20.

Figure 12:
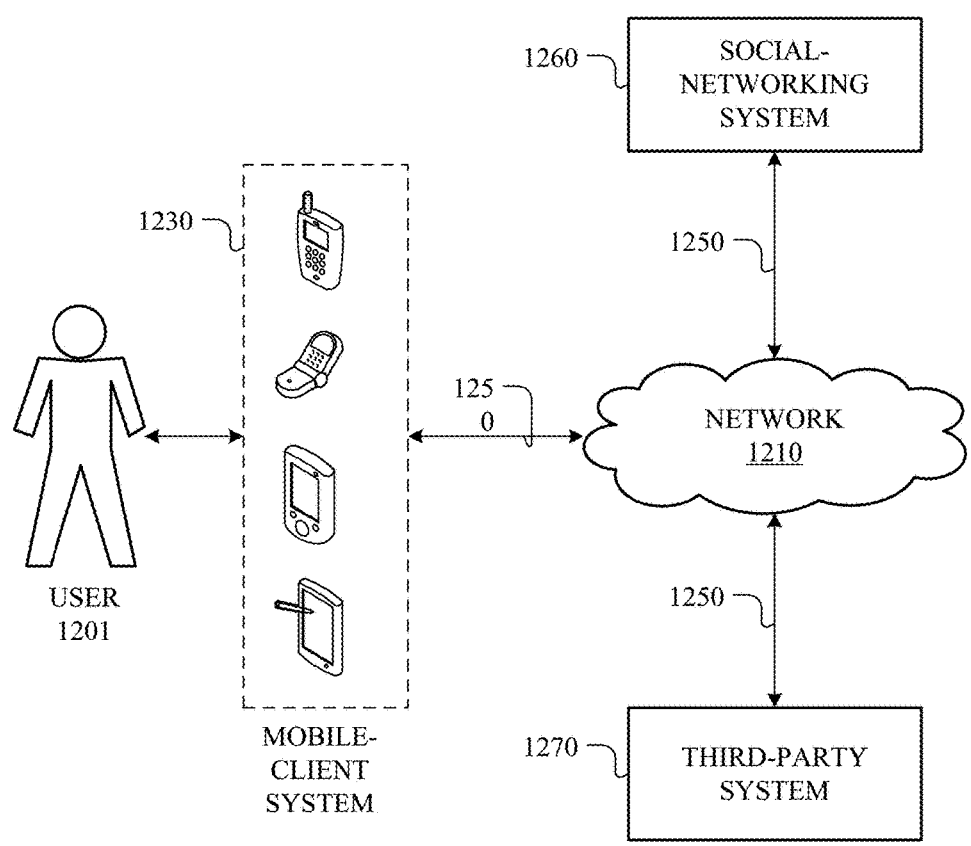
FIG. 12 illustrates an example network environment associated with a social-networking system.

FIG. 12 illustrates an example network environment 1200 associated with a social-networking system. Network environment 1200 includes a user 1201, a client system 1230, a social-networking system 1260, and a third-party system 1270 connected to each other by a network 1210. Although FIG. 12 illustrates a particular arrangement of user 1201, client system 1230, social-networking system 1260, third-party system 1270, and network 1210, this disclosure contemplates any suitable arrangement of user 1201, client system 1230, social-networking system 1260, third-party system 1270, and network 1210. As an example and not by way of limitation, two or more of client system 1230, social-networking system 1260, and third-party system 1270 may be connected to each other directly, bypassing network 1210. As another example, two or more of client system 1230, social-networking system 1260, and third-party system 1270 may be physically or logically co-located with each other in whole or in part. Moreover, although FIG. 12 illustrates a particular number of users 1201, client systems 1230, social-networking systems 1260, third-party systems 1270, and networks 1210, this disclosure contemplates any suitable number of users 1201, client systems 1230, social-networking systems 1260, third-party systems 1270, and networks 1210. As an example and not by way of limitation, network environment 1200 may include multiple users 1201, client system 1230, social-networking systems 1260, third-party systems 1270, and networks 1210.

In particular embodiments, user 1201 may be an individual (human user), an entity (e.g., an enterprise, business, or third-party application), or a group (e.g., of individuals or entities) that interacts or communicates with or over social-networking system 1260. In particular embodiments, social-networking system 1260 may be a network-addressable computing system hosting an online social network. Social-networking system 1260 may generate, store, receive, and send social-networking data, such as, for example, user-profile data, concept-profile data, social-graph information, or other suitable data related to the online social network. Social-networking system 1260 may be accessed by the other components of network environment 1200 either directly or via network 1210. In particular embodiments, social-networking system 1260 may include an authorization server (or other suitable component(s)) that allows users 1201 to opt in to or opt out of having their actions logged by social-networking system 1260 or shared with other systems (e.g., third-party systems 1270), for example, by setting appropriate privacy settings. A privacy setting of a user may determine what information associated with the user may be logged, how information associated with the user may be logged, when information associated with the user may be logged, who may log information associated with the user, whom information associated with the user may be shared with, and for what purposes information associated with the user may be logged or shared. Authorization servers may be used to enforce one or more privacy settings of the users of social-networking system 30 through blocking, data hashing, anonymization, or other suitable techniques as appropriate. Third-party system 1270 may be accessed by the other components of network environment 1200 either directly or via network 1210. In particular embodiments, one or more users 1201 may use one or more client systems 1230 to access, send data to, and receive data from social-networking system 1260 or third-party system 1270. Client system 1230 may access social-networking system 1260 or third-party system 1270 directly, via network 1210, or via a third-party system. As an example and not by way of limitation, client system 1230 may access third-party system 1270 via social-networking system 1260. Client system 1230 may be any suitable computing device, such as, for example, a personal computer, a laptop computer, a cellular telephone, a smartphone, a tablet computer, or an augmented/virtual reality device.

This disclosure contemplates any suitable network 1210. As an example and not by way of limitation, one or more portions of network 1210 may include an ad hoc network, an intranet, an extranet, a virtual private network (VPN), a local area network (LAN), a wireless LAN (WLAN), a wide area network (WAN), a wireless WAN (WWAN), a metropolitan area network (MAN), a portion of the Internet, a portion of the Public Switched Telephone Network (PSTN), a cellular telephone network, or a combination of two or more of these. Network 1210 may include one or more networks 1210.

Links 1250 may connect client system 1230, social-networking system 1260, and third-party system 1270 to communication network 1210 or to each other. This disclosure contemplates any suitable links 1250. In particular embodiments, one or more links 1250 include one or more wireline (such as for example Digital Subscriber Line (DSL) or Data Over Cable Service Interface Specification (DOCSIS)), wireless (such as for example Wi-Fi or Worldwide Interoperability for Microwave Access (WiMAX)), or optical (such as for example Synchronous Optical Network (SONET) or Synchronous Digital Hierarchy (SDH)) links. In particular embodiments, one or more links 1250 each include an ad hoc network, an intranet, an extranet, a VPN, a LAN, a WLAN, a WAN, a WWAN, a MAN, a portion of the Internet, a portion of the PSTN, a cellular technology-based network, a satellite communications technology-based network, another link 1250, or a combination of two or more such links 1250. Links 1250 need not necessarily be the same throughout network environment 1200. One or more first links 1250 may differ in one or more respects from one or more second links 1250.

Figure 13:
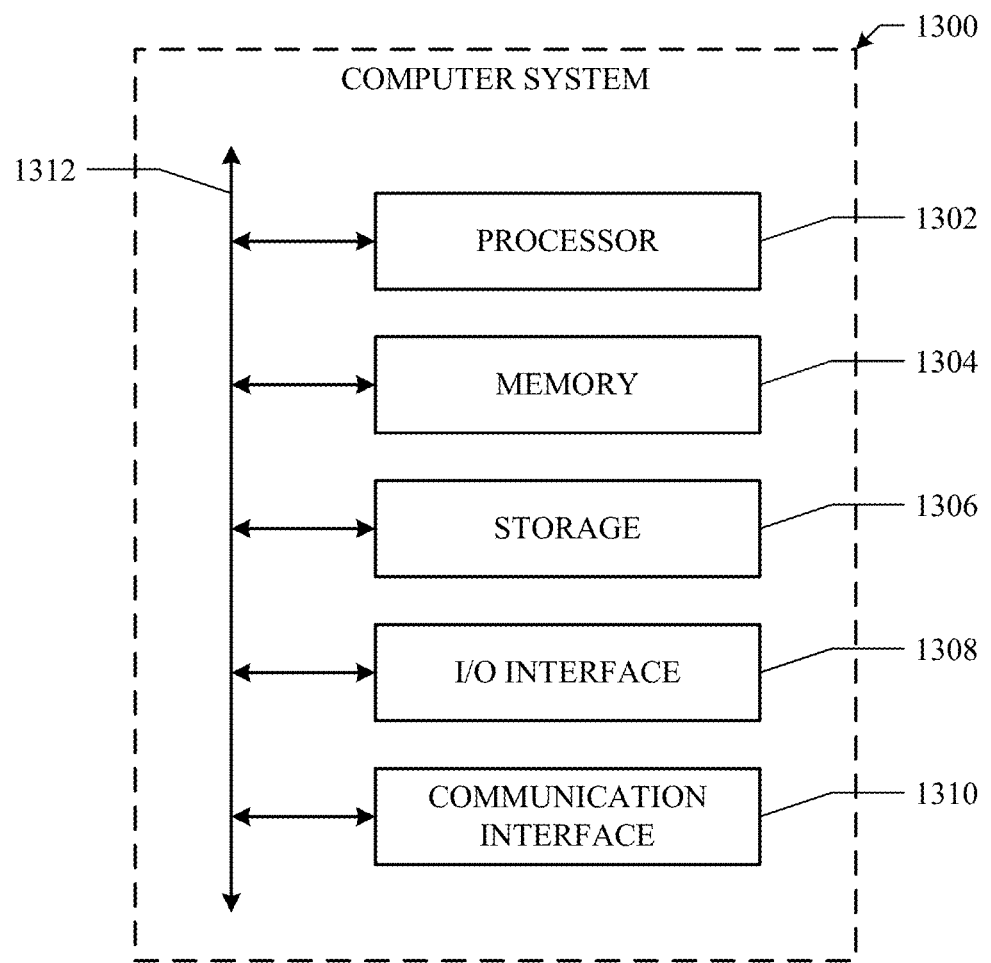
FIG. 13 illustrates an example computer system.

FIG. 13 illustrates an example computer system 1300. In particular embodiments, one or more computer systems 1300 perform one or more steps of one or more methods described or illustrated herein. In particular embodiments, one or more computer systems 1300 provide functionality described or illustrated herein. In particular embodiments, software running on one or more computer systems 1300 performs one or more steps of one or more methods described or illustrated herein or provides functionality described or illustrated herein. Particular embodiments include one or more portions of one or more computer systems 1300. Herein, reference to a computer system may encompass a computing device, and vice versa, where appropriate. Moreover, reference to a computer system may encompass one or more computer systems, where appropriate.

This disclosure contemplates any suitable number of computer systems 1300. This disclosure contemplates computer system 1300 taking any suitable physical form. As example and not by way of limitation, computer system 1300 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an augmented/virtual reality device, or a combination of two or more of these. Where appropriate, computer system 1300 may include one or more computer systems 1300; be unitary or distributed; span multiple locations; span multiple machines; span multiple data centers; or reside in a cloud, which may include one or more cloud components in one or more networks. Where appropriate, one or more computer systems 1300 may perform without substantial spatial or temporal limitation one or more steps of one or more methods described or illustrated herein. As an example and not by way of limitation, one or more computer systems 1300 may perform in real time or in batch mode one or more steps of one or more methods described or illustrated herein. One or more computer systems 1300 may perform at different times or at different locations one or more steps of one or more methods described or illustrated herein, where appropriate.

In particular embodiments, computer system 1300 includes a processor 1302, memory 1304, storage 1306, an input/output (I/O) interface 1308, a communication interface 1310, and a bus 1312. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1302 includes hardware for executing instructions, such as those making up a computer program. As an example and not by way of limitation, to execute instructions, processor 1302 may retrieve (or fetch) the instructions from an internal register, an internal cache, memory 1304, or storage 1306; decode and execute them; and then write one or more results to an internal register, an internal cache, memory 1304, or storage 1306. In particular embodiments, processor 1302 may include one or more internal caches for data, instructions, or addresses. This disclosure contemplates processor 1302 including any suitable number of any suitable internal caches, where appropriate. As an example and not by way of limitation, processor 1302 may include one or more instruction caches, one or more data caches, and one or more translation lookaside buffers (TLBs). Instructions in the instruction caches may be copies of instructions in memory 1304 or storage 1306, and the instruction caches may speed up retrieval of those instructions by processor 1302. Data in the data caches may be copies of data in memory 1304 or storage 1306 for instructions executing at processor 1302 to operate on; the results of previous instructions executed at processor 1302 for access by subsequent instructions executing at processor 1302 or for writing to memory 1304 or storage 1306; or other suitable data. The data caches may speed up read or write operations by processor 1302. The TLBs may speed up virtual-address translation for processor 1302. In particular embodiments, processor 1302 may include one or more internal registers for data, instructions, or addresses. This disclosure contemplates processor 1302 including any suitable number of any suitable internal registers, where appropriate. Where appropriate, processor 1302 may include one or more arithmetic logic units (ALUs); be a multi-core processor; or include one or more processors 1302. Although this disclosure describes and illustrates a particular processor, this disclosure contemplates any suitable processor.

In particular embodiments, memory 1304 includes main memory for storing instructions for processor 1302 to execute or data for processor 1302 to operate on. As an example and not by way of limitation, computer system 1300 may load instructions from storage 1306 or another source (such as, for example, another computer system 1300) to memory 1304. Processor 1302 may then load the instructions from memory 1304 to an internal register or internal cache. To execute the instructions, processor 1302 may retrieve the instructions from the internal register or internal cache and decode them. During or after execution of the instructions, processor 1302 may write one or more results (which may be intermediate or final results) to the internal register or internal cache. Processor 1302 may then write one or more of those results to memory 1304. In particular embodiments, processor 1302 executes only instructions in one or more internal registers or internal caches or in memory 1304 (as opposed to storage 1306 or elsewhere) and operates only on data in one or more internal registers or internal caches or in memory 1304 (as opposed to storage 1306 or elsewhere). One or more memory buses (which may each include an address bus and a data bus) may couple processor 1302 to memory 1304. Bus 1312 may include one or more memory buses, as described below. In particular embodiments, one or more memory management units (MMUs) reside between processor 1302 and memory 1304 and facilitate accesses to memory 1304 requested by processor 1302. In particular embodiments, memory 1304 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1304 may include one or more memories 1304, where appropriate. Although this disclosure describes and illustrates particular memory, this disclosure contemplates any suitable memory.

In particular embodiments, storage 1306 includes mass storage for data or instructions. As an example and not by way of limitation, storage 1306 may include a hard disk drive (HDD), a floppy disk drive, flash memory, an optical disc, a magneto-optical disc, magnetic tape, or a Universal Serial Bus (USB) drive or a combination of two or more of these. Storage 1306 may include removable or non-removable (or fixed) media, where appropriate. Storage 1306 may be internal or external to computer system 1300, where appropriate. In particular embodiments, storage 1306 is non-volatile, solid-state memory. In particular embodiments, storage 1306 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1306 taking any suitable physical form. Storage 1306 may include one or more storage control units facilitating communication between processor 1302 and storage 1306, where appropriate. Where appropriate, storage 1306 may include one or more storages 1306. Although this disclosure describes and illustrates particular storage, this disclosure contemplates any suitable storage.

In particular embodiments, I/O interface 1308 includes hardware, software, or both, providing one or more interfaces for communication between computer system 1300 and one or more I/O devices. Computer system 1300 may include one or more of these I/O devices, where appropriate. One or more of these I/O devices may enable communication between a person and computer system 1300. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1308 for them. Where appropriate, I/O interface 1308 may include one or more device or software drivers enabling processor 1302 to drive one or more of these I/O devices. I/O interface 1308 may include one or more I/O interfaces 1308, where appropriate. Although this disclosure describes and illustrates a particular I/O interface, this disclosure contemplates any suitable I/O interface.

In particular embodiments, communication interface 1310 includes hardware, software, or both providing one or more interfaces for communication (such as, for example, packet-based communication) between computer system 1300 and one or more other computer systems 1300 or one or more networks. As an example and not by way of limitation, communication interface 1310 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1310 for it. As an example and not by way of limitation, computer system 1300 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1300 may communicate with a wireless PAN (WPAN) (such as, for example, a BLUETOOTH WPAN), a WI-FI network, a WI-MAX network, a cellular telephone network (such as, for example, a Global System for Mobile Communications (GSM) network), or other suitable wireless network or a combination of two or more of these. Computer system 1300 may include any suitable communication interface 1310 for any of these networks, where appropriate. Communication interface 1310 may include one or more communication interfaces 1310, where appropriate. Although this disclosure describes and illustrates a particular communication interface, this disclosure contemplates any suitable communication interface.

In particular embodiments, bus 1312 includes hardware, software, or both coupling components of computer system 1300 to each other. As an example and not by way of limitation, bus 1312 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1312 may include one or more buses 1312, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A method, comprising:
by a computing system, receiving a model definition of a virtual object;
by the computing system, rendering the virtual object in a 3D space based on the model definition;
by the computing system, displaying the virtual object in the 3D space from a first perspective in a first display area of a user interface;
by the computing system, displaying the virtual object in the 3D space from a second perspective in a second display area of the user interface, the second perspective being different from the first perspective;
by the computing system, receiving a user command for adjusting the virtual object, the user command being input by a user through the first display area;
by the computing system, adjusting the virtual object according to the user command;
by the computing system, displaying the adjusted virtual object in the 3D space from the first perspective in the first display area;
by the computing system, displaying the adjusted virtual object in the 3D space from the second perspective in the second display area; and
by the computing system, outputting an adjusted model definition of the adjusted virtual object.

2. The method of claim 1, further comprising:
by the computing system, receiving a second user command for adjusting the virtual object, the user command being input by a user through the second display area;
by the computing system, further adjusting the adjusted virtual object according to the second user command;
by the computing system, displaying the further adjusted virtual object in the 3D space from the first perspective in the first display area; and
by the computing system, displaying the further adjusted virtual object in the 3D space from the second perspective in the second display area.

3. The method of claim 1, further comprising:
by the computing system, displaying a representation of a mobile device and its focal plane in the 3D space from the first perspective in the first display area; and
by the computing system, displaying the representation of the mobile device and its focal plane in the 3D space from the second perspective in the second display area;
wherein the representation of the focal plane corresponds to a focal plane of a first camera of the mobile device.

4. The method of claim 3, further comprising:
by the computing system, receiving a second user command to enable a second camera of the mobile device and to disable the first camera of the mobile device;
by the computing system, in response to the second user command:
displaying a second representation of a second focal plane in the 3D space from the first perspective in the first display area;
displaying the second representation of the second focal plane in the 3D space from the second perspective in the second display area; and
ceasing to display the representation of the focal plane;
wherein the second representation of the second focal plane corresponds to a focal plane of the second camera.

5. The method of claim 3, further comprising:
by the computing system, receiving a second user command to change an orientation of the representation of the mobile device; and
by the computing system, in response to the second user command, changing the orientation of the displayed representation of the mobile device and its focal plane in the first display area and the second display area.

6. The method of claim 5, wherein the second user command to change the orientation is based on gyroscope data received from a device communicatively coupled to the computing system, wherein the device comprises a gyroscope.

7. The method of claim 1, wherein the 3D space comprises a representation of a mobile device, the method further comprising:
by the computing system, displaying in a third display area a scene in the 3D space, the scene representing a view from the mobile device through its focal plane.

8. The method of claim 1, wherein the 3D space comprises a video sphere centered at the mobile device, the method further comprising:
by the computing system, displaying a background in the third display area, the background being a portion of the video sphere selected based on an orientation of the mobile device.

9. The method of claim 8, further comprising:
by the computing system, overlaying a video of a person on top of the background.

10. The method of claim 9, wherein an effect associated with the virtual object is configured to be triggered by motions of the person.

11. The method of claim 7, wherein the virtual object is configured to be displayed in the focal plane of the mobile device regardless of the mobile device's orientation.

12. The method of claim 7, wherein the virtual object is configured to be displayed in the third display area when mobile device is oriented such that the virtual object is visible through the focal plane.

13. The method of claim 1, wherein the virtual object is configurable to be associated with a first camera of a mobile device or a second camera of the mobile device;
wherein when the virtual object is associated with the first camera, the virtual object is displayable in a scene captured by the first camera and not displayable in a scene captured by the second camera; and
wherein when the virtual object is associated with the second camera, the virtual object is displayable in a scene captured by the second camera and not displayable in a scene captured by the first camera.

14. One or more computer-readable non-transitory storage media embodying software that is operable when executed to:
receive a model definition of a virtual object;
render the virtual object in a 3D space based on the model definition;
display the virtual object in the 3D space from a first perspective in a first display area of a user interface;
display the virtual object in the 3D space from a second perspective in a second display area of the user interface, the second perspective being different from the first perspective;
receive a user command for adjusting the virtual object, the user command being input by a user through the first display area;
adjust the virtual object according to the user command;
display the adjusted virtual object in the 3D space from the first perspective in the first display area;
display the adjusted virtual object in the 3D space from the second perspective in the second display area; and
output an adjusted model definition of the adjusted virtual object.

15. The media of claim 14, wherein the software is further operable when executed to:
display a representation of a mobile device and its focal plane in the 3D space from the first perspective in the first display area; and
display the representation of the mobile device and its focal plane in the 3D space from the second perspective in the second display area;
wherein the representation of the focal plane corresponds to a focal plane of a first camera of the mobile device.

16. The media of claim 15, wherein the software is further operable when executed to:
receive a second user command to enable a second camera of the mobile device and to disable the first camera of the mobile device;
in response to the second user command:
display a second representation of a second focal plane in the 3D space from the first perspective in the first display area;
display the second representation of the second focal plane in the 3D space from the second perspective in the second display area; and
cease to display the representation of the focal plane;
wherein the second representation of the second focal plane corresponds to a focal plane of the second camera.

17. The media of claim 14, wherein the virtual object is configurable to be associated with a first camera of a mobile device or a second camera of the mobile device;
wherein when the virtual object is associated with the first camera, the virtual object is displayable in a scene captured by the first camera and not displayable in a scene captured by the second camera; and
wherein when the virtual object is associated with the second camera, the virtual object is displayable in a scene captured by the second camera and not displayable in a scene captured by the first camera.

18. A system comprising:
one or more processors; and
one or more computer-readable non-transitory storage media coupled to one or more of the processors and comprising instructions operable when executed by one or more of the processors to cause the system to:
receive a model definition of a virtual object;

render the virtual object in a 3D space based on the model definition;

display the virtual object in the 3D space from a first perspective in a first display area of a user interface;

display the virtual object in the 3D space from a second perspective in a second display area of the user interface, the second perspective being different from the first perspective;

receive a user command for adjusting the virtual object, the user command being input by a user through the first display area;

adjust the virtual object according to the user command;

display the adjusted virtual object in the 3D space from the first perspective in the first display area;

display the adjusted virtual object in the 3D space from the second perspective in the second display area; and output an adjusted model definition of the adjusted virtual object.

19. The system of claim 18, wherein the processors are further operable when executing the instructions to:

display a representation of a mobile device and its focal plane in the 3D space from the first perspective in the first display area; and display the representation of the mobile device and its focal plane in the 3D space from the second perspective in the second display area;

wherein the representation of the focal plane corresponds to a focal plane of a first camera of the mobile device.

20. The system of claim 18, wherein the virtual object is configurable to be associated with a first camera of a mobile device or a second camera of the mobile device;

wherein when the virtual object is associated with the first camera, the virtual object is displayable in a scene captured by the first camera and not displayable in a scene captured by the second camera; and wherein when the virtual object is associated with the second camera, the virtual object is displayable in a scene captured by the second camera and not displayable in a scene captured by the first camera.

* * * * *